United States Patent
Nassie

(10) Patent No.: US 9,786,388 B1
(45) Date of Patent: Oct. 10, 2017

(54) DETECTING AND MANAGING BAD COLUMNS

(71) Applicant: AVAGO TECHNOLOGIES GENERAL IP (SINGAPORE) PTE. LTD., Yishun (SG)

(72) Inventor: Amir Nassie, Moshav Salit (IL)

(73) Assignee: AVAGO TECHNOLOGIES GENERAL IP (SINGAPORE) PTE. LTD. (SG)

( * ) Notice: Subject to any disclaimer, the term of this patent is extended or adjusted under 35 U.S.C. 154(b) by 21 days.

(21) Appl. No.: 14/050,249

(22) Filed: Oct. 9, 2013

(51) Int. Cl.
| | |
|---|---|
| *G11C 29/56* | (2006.01) |
| *G11C 29/00* | (2006.01) |
| *G11C 29/04* | (2006.01) |
| *G11C 29/12* | (2006.01) |
| *G06F 12/02* | (2006.01) |
| *G06F 11/10* | (2006.01) |
| *G11C 29/44* | (2006.01) |

(52) U.S. Cl.
CPC .... *G11C 29/56008* (2013.01); *G06F 11/1068* (2013.01); *G06F 12/0246* (2013.01); *G11C 29/00* (2013.01); *G11C 29/04* (2013.01); *G11C 29/12* (2013.01); *G11C 2029/1208* (2013.01); *G11C 2029/4402* (2013.01); *G11C 2029/5606* (2013.01)

(58) Field of Classification Search
CPC ........ G11C 29/00; G11C 29/04; G11C 29/12; G11C 2029/1208; G11C 2029/4402; G11C 29/56008; G11C 2029/5606; G06F 11/1068; G06F 12/0246

USPC ................ 714/718, 719, 723, 773, 704, 48; 365/200, 201, 185.33, 185.09, 185.22; 711/103
See application file for complete search history.

(56) References Cited

U.S. PATENT DOCUMENTS

| | | |
|---|---|---|
| 4,430,701 A | 2/1984 | Christian et al. |
| 4,463,375 A | 7/1984 | Macovski |
| 4,584,686 A | 4/1986 | Fritze |
| 4,589,084 A | 5/1986 | Fling et al. |
| 4,777,589 A | 10/1988 | Boettner et al. |
| 4,866,716 A | 9/1989 | Weng |
| 5,003,597 A | 3/1991 | Merkle |
| 5,077,737 A | 12/1991 | Leger et al. |

(Continued)

OTHER PUBLICATIONS

Lakshmi et al., Detection of High Accuracy Bist-Based Fault Diagnosis for Embedded Read-Only Memories, Sep. 2012, International Journal of Engineering Research & Technology (IJERT), vol. 1, Issue 7, pp. 1-7.*

(Continued)

*Primary Examiner* — John J Tabone, Jr.
(74) *Attorney, Agent, or Firm* — Sheridan Ross P.C.

(57) ABSTRACT

A system, computer readable medium and a method. The method may include sending input data to a NAND flash memory unit that comprises the NAND flash memory array and instructing the NAND flash memory unit to write input data to the NAND flash memory array to provide programmed data; reading from the NAND flash memory array the programmed data to provide read data; comparing the input data and the read data to provide column errors statistics at a column resolution; and defining, by a flash memory controller, bad columns of the NAND flash memory array in response to the column error statistics.

20 Claims, 12 Drawing Sheets

(56) References Cited

U.S. PATENT DOCUMENTS

| | | |
|---|---|---|
| 5,297,153 A | 3/1994 | Baggen et al. |
| 5,305,276 A | 4/1994 | Uenoyama |
| 5,592,641 A | 1/1997 | Doyle et al. |
| 5,623,620 A | 4/1997 | Alexis et al. |
| 5,640,529 A | 6/1997 | Hasbun |
| 5,657,332 A | 8/1997 | Auclair et al. |
| 5,663,901 A | 9/1997 | Harari et al. |
| 5,724,538 A | 3/1998 | Morris |
| 5,729,490 A | 3/1998 | Calligaro et al. |
| 5,740,395 A | 4/1998 | Wells |
| 5,745,418 A | 4/1998 | Hu et al. |
| 5,778,430 A | 7/1998 | Ish |
| 5,793,774 A | 8/1998 | Usui et al. |
| 5,920,578 A | 7/1999 | Zook et al. |
| 5,926,409 A | 7/1999 | Engh et al. |
| 5,933,368 A | 8/1999 | Hu et al. |
| 5,956,268 A | 9/1999 | Lee |
| 5,956,473 A | 9/1999 | Hu et al. |
| 5,968,198 A | 10/1999 | Balachandran |
| 5,982,659 A | 11/1999 | Irrinki et al. |
| 6,011,741 A | 1/2000 | Harari et al. |
| 6,016,275 A | 1/2000 | Han |
| 6,038,634 A | 3/2000 | Ji et al. |
| 6,081,878 A | 6/2000 | Estakhri |
| 6,094,465 A | 7/2000 | Stein et al. |
| 6,119,245 A | 9/2000 | Hiratsuka |
| 6,182,261 B1 | 1/2001 | Haller et al. |
| 6,192,497 B1 | 2/2001 | Yang et al. |
| 6,195,287 B1 | 2/2001 | Hirano |
| 6,199,188 B1 | 3/2001 | Shen et al. |
| 6,209,114 B1 | 3/2001 | Wolf et al. |
| 6,259,627 B1 | 7/2001 | Wong |
| 6,272,052 B1 | 8/2001 | Miyauchi |
| 6,278,633 B1 | 8/2001 | Wong et al. |
| 6,279,133 B1 | 8/2001 | Vafai et al. |
| 6,301,151 B1 | 10/2001 | Engh et al. |
| 6,370,061 B1 | 4/2002 | Yachareni et al. |
| 6,374,383 B1 | 4/2002 | Weng |
| 6,504,891 B1 | 1/2003 | Chevallier |
| 6,532,169 B1 | 3/2003 | Mann et al. |
| 6,532,556 B1 | 3/2003 | Wong et al. |
| 6,553,533 B2 | 4/2003 | Demura et al. |
| 6,560,747 B1 | 5/2003 | Weng |
| 6,637,002 B1 | 10/2003 | Weng et al. |
| 6,639,865 B2 | 10/2003 | Kwon |
| 6,674,665 B1 | 1/2004 | Mann et al. |
| 6,675,281 B1 | 1/2004 | Oh |
| 6,704,902 B1 | 3/2004 | Shinbashi et al. |
| 6,751,766 B2 | 6/2004 | Guterman et al. |
| 6,772,274 B1 | 8/2004 | Estakhri |
| 6,781,910 B2 | 8/2004 | Smith |
| 6,792,569 B2 | 9/2004 | Cox et al. |
| 6,873,543 B2 | 3/2005 | Smith et al. |
| 6,891,768 B2 | 5/2005 | Smith et al. |
| 6,914,809 B2 | 7/2005 | Hilton et al. |
| 6,915,477 B2 | 7/2005 | Gollamudi et al. |
| 6,952,365 B2 | 10/2005 | Gonzalez et al. |
| 6,961,890 B2 | 11/2005 | Smith |
| 6,968,421 B2 | 11/2005 | Conley |
| 6,990,012 B2 | 1/2006 | Smith et al. |
| 6,996,004 B1 | 2/2006 | Fastow et al. |
| 6,999,854 B2 | 2/2006 | Roth |
| 7,010,739 B1 | 3/2006 | Feng et al. |
| 7,012,835 B2 | 3/2006 | Gonzalez et al. |
| 7,038,950 B1 | 5/2006 | Hamilton et al. |
| 7,068,539 B2 | 6/2006 | Guterman et al. |
| 7,079,436 B2 | 7/2006 | Perner et al. |
| 7,149,950 B2 | 12/2006 | Spencer et al. |
| 7,177,977 B2 | 2/2007 | Chen et al. |
| 7,188,228 B1 | 3/2007 | Chang et al. |
| 7,191,379 B2 | 3/2007 | Adelmann et al. |
| 7,196,946 B2 | 3/2007 | Chen et al. |
| 7,203,874 B2 | 4/2007 | Roohparvar |
| 7,212,426 B2 | 5/2007 | Park |
| 7,290,203 B2 | 10/2007 | Emma et al. |
| 7,292,365 B2 | 11/2007 | Knox |
| 7,301,928 B2 | 11/2007 | Nakabayashi et al. |
| 7,315,916 B2 | 1/2008 | Bennett |
| 7,388,781 B2 | 6/2008 | Litsyn |
| 7,395,404 B2 | 7/2008 | Gorobets |
| 7,441,067 B2 | 10/2008 | Gorobets et al. |
| 7,443,729 B2 | 10/2008 | Li |
| 7,450,425 B2 | 11/2008 | Aritome |
| 7,454,670 B2 | 11/2008 | Kim et al. |
| 7,466,575 B2 | 12/2008 | Shalvi et al. |
| 7,533,328 B2 | 5/2009 | Alrod et al. |
| 7,558,109 B2 | 7/2009 | Brandman et al. |
| 7,593,263 B2 | 9/2009 | Sokolov et al. |
| 7,610,433 B2 | 10/2009 | Randell et al. |
| 7,613,043 B2 | 11/2009 | Cornwell |
| 7,619,922 B2 | 11/2009 | Li |
| 7,697,326 B2 | 4/2010 | Sommer et al. |
| 7,706,182 B2 | 4/2010 | Shalvi et al. |
| 7,716,538 B2 | 5/2010 | Gonzalez |
| 7,804,718 B2 | 9/2010 | Kim |
| 7,805,663 B2 | 9/2010 | Brandman et al. |
| 7,805,664 B1 | 9/2010 | Yang et al. |
| 7,844,877 B2 | 11/2010 | Litsyn et al. |
| 7,911,848 B2 | 3/2011 | Eun |
| 7,961,797 B1 | 6/2011 | Yang et al. |
| 7,975,192 B2 | 7/2011 | Sommer |
| 8,020,073 B2 | 9/2011 | Emma et al. |
| 8,108,590 B2 | 1/2012 | Chow et al. |
| 8,122,328 B2 | 2/2012 | Liu et al. |
| 8,159,881 B2 | 4/2012 | Yang |
| 8,190,961 B1 | 5/2012 | Yang |
| 8,250,324 B2 | 8/2012 | Haas |
| 8,300,823 B2 | 10/2012 | Bojinov |
| 8,305,812 B2 | 11/2012 | Levy |
| 8,327,246 B2 | 12/2012 | Weingarten |
| 8,407,560 B2 | 3/2013 | Ordentlich |
| 8,417,893 B2 | 4/2013 | Khmelnitsky |
| 8,526,238 B2* | 9/2013 | Moschiano et al. ...... 365/185.22 |
| 8,711,625 B2* | 4/2014 | Li et al. .................. 365/185.09 |
| 2001/0034815 A1 | 10/2001 | Dugan et al. |
| 2002/0063774 A1 | 5/2002 | Hillis et al. |
| 2002/0085419 A1 | 7/2002 | Kwon |
| 2002/0154769 A1 | 10/2002 | Petersen et al. |
| 2002/0156988 A1 | 10/2002 | Toyama |
| 2002/0174156 A1 | 11/2002 | Birru |
| 2003/0014582 A1 | 1/2003 | Nakanishi |
| 2003/0053142 A1* | 3/2003 | Wengender ................ 358/437 |
| 2003/0065876 A1 | 4/2003 | Lasser |
| 2003/0101404 A1 | 5/2003 | Zhao et al. |
| 2003/0105620 A1 | 6/2003 | Bowen |
| 2003/0177300 A1 | 9/2003 | Lee |
| 2003/0192007 A1 | 10/2003 | Miller et al. |
| 2003/0221144 A1* | 11/2003 | Shimada et al. ............. 714/710 |
| 2004/0015771 A1 | 1/2004 | Lasser et al. |
| 2004/0030971 A1 | 2/2004 | Tanaka |
| 2004/0059768 A1 | 3/2004 | Denk |
| 2004/0062135 A1* | 4/2004 | Itakura .......................... 365/232 |
| 2004/0080985 A1 | 4/2004 | Chang et al. |
| 2004/0153722 A1 | 8/2004 | Lee |
| 2004/0153817 A1 | 8/2004 | Norman |
| 2004/0181735 A1 | 9/2004 | Xin |
| 2004/0203591 A1 | 10/2004 | Lee |
| 2004/0210706 A1 | 10/2004 | In et al. |
| 2005/0013165 A1 | 1/2005 | Ban |
| 2005/0018482 A1 | 1/2005 | Cemea et al. |
| 2005/0083735 A1 | 4/2005 | Chen et al. |
| 2005/0117401 A1 | 6/2005 | Chen et al. |
| 2005/0120265 A1 | 6/2005 | Pline et al. |
| 2005/0128811 A1 | 6/2005 | Kato et al. |
| 2005/0138533 A1 | 6/2005 | Le-Bars et al. |
| 2005/0144213 A1 | 6/2005 | Simkins et al. |
| 2005/0144368 A1 | 6/2005 | Chung et al. |
| 2005/0169057 A1 | 8/2005 | Shibata |
| 2005/0172179 A1 | 8/2005 | Brandenberger et al. |
| 2005/0213393 A1 | 9/2005 | Lasser |
| 2005/0243626 A1 | 11/2005 | Ronen |
| 2006/0059406 A1 | 3/2006 | Micheloni et al. |
| 2006/0059409 A1 | 3/2006 | Lee |
| 2006/0064537 A1 | 3/2006 | Oshima |

(56) References Cited

U.S. PATENT DOCUMENTS

| | | |
|---|---|---|
| 2006/0101193 A1 | 5/2006 | Murin |
| 2006/0171202 A1* | 8/2006 | Kawamoto et al. ..... 365/185.17 |
| 2006/0195651 A1 | 8/2006 | Estakhri |
| 2006/0203587 A1 | 9/2006 | Li et al. |
| 2006/0221692 A1 | 10/2006 | Chen |
| 2006/0248434 A1 | 11/2006 | Radke et al. |
| 2006/0256631 A1* | 11/2006 | Nobunaga et al. ........... 365/201 |
| 2006/0268608 A1 | 11/2006 | Noguchi et al. |
| 2006/0282411 A1 | 12/2006 | Fagin et al. |
| 2006/0284244 A1 | 12/2006 | Forbes |
| 2006/0294312 A1 | 12/2006 | Walmsley |
| 2007/0025157 A1 | 2/2007 | Wan et al. |
| 2007/0063180 A1 | 3/2007 | Asano et al. |
| 2007/0081388 A1 | 4/2007 | Joo |
| 2007/0098069 A1 | 5/2007 | Gordon |
| 2007/0103992 A1 | 5/2007 | Sakui et al. |
| 2007/0104004 A1 | 5/2007 | So et al. |
| 2007/0109858 A1 | 5/2007 | Conley et al. |
| 2007/0124652 A1 | 5/2007 | Litsyn et al. |
| 2007/0140006 A1 | 6/2007 | Chen |
| 2007/0143561 A1 | 6/2007 | Gorobets |
| 2007/0150694 A1 | 6/2007 | Chang et al. |
| 2007/0168625 A1 | 7/2007 | Cornwell et al. |
| 2007/0171714 A1 | 7/2007 | Wu et al. |
| 2007/0171730 A1 | 7/2007 | Ramamoorthy et al. |
| 2007/0180346 A1 | 8/2007 | Murin |
| 2007/0223277 A1 | 9/2007 | Tanaka et al. |
| 2007/0226582 A1 | 9/2007 | Tang et al. |
| 2007/0226592 A1 | 9/2007 | Radke |
| 2007/0228449 A1 | 10/2007 | Takano et al. |
| 2007/0253249 A1 | 11/2007 | Kang et al. |
| 2007/0253250 A1 | 11/2007 | Shibata |
| 2007/0255982 A1* | 11/2007 | Adsitt ............................ 714/718 |
| 2007/0263439 A1 | 11/2007 | Cornwell et al. |
| 2007/0266291 A1 | 11/2007 | Toda et al. |
| 2007/0271494 A1 | 11/2007 | Gorobets |
| 2007/0297226 A1 | 12/2007 | Mokhlesi |
| 2008/0010581 A1 | 1/2008 | Alrod et al. |
| 2008/0028014 A1 | 1/2008 | Hilt et al. |
| 2008/0049497 A1 | 2/2008 | Mo |
| 2008/0055989 A1 | 3/2008 | Lee |
| 2008/0082897 A1 | 4/2008 | Brandman et al. |
| 2008/0092026 A1 | 4/2008 | Brandman et al. |
| 2008/0104309 A1 | 5/2008 | Cheon et al. |
| 2008/0112238 A1 | 5/2008 | Kim |
| 2008/0116509 A1 | 5/2008 | Harari et al. |
| 2008/0126686 A1 | 5/2008 | Sokolov et al. |
| 2008/0127104 A1* | 5/2008 | Li et al. ........................ 717/126 |
| 2008/0128790 A1 | 6/2008 | Jung |
| 2008/0130341 A1 | 6/2008 | Shalvi et al. |
| 2008/0137413 A1 | 6/2008 | Kong et al. |
| 2008/0137414 A1 | 6/2008 | Park et al. |
| 2008/0141043 A1 | 6/2008 | Flynn et al. |
| 2008/0148115 A1 | 6/2008 | Sokolov |
| 2008/0158958 A1 | 7/2008 | Shavi et al. |
| 2008/0159059 A1 | 7/2008 | Moyer |
| 2008/0162079 A1 | 7/2008 | Astigarraga et al. |
| 2008/0168216 A1 | 7/2008 | Lee |
| 2008/0168320 A1 | 7/2008 | Cassuto et al. |
| 2008/0181001 A1 | 7/2008 | Shalvi |
| 2008/0198650 A1 | 8/2008 | Shalvi et al. |
| 2008/0198652 A1 | 8/2008 | Shalvi et al. |
| 2008/0201620 A1 | 8/2008 | Gollub |
| 2008/0209114 A1 | 8/2008 | Chow et al. |
| 2008/0219050 A1 | 9/2008 | Shalvi et al. |
| 2008/0225599 A1 | 9/2008 | Chae |
| 2008/0244340 A1* | 10/2008 | Doi ............................... 714/711 |
| 2008/0250195 A1 | 10/2008 | Chow et al. |
| 2008/0263262 A1 | 10/2008 | Sokolov et al. |
| 2008/0282106 A1 | 11/2008 | Shalvi et al. |
| 2008/0285351 A1 | 11/2008 | Shlick et al. |
| 2008/0301532 A1 | 12/2008 | Uchikawa et al. |
| 2009/0024905 A1 | 1/2009 | Shalvi et al. |
| 2009/0027961 A1 | 1/2009 | Park |
| 2009/0043951 A1 | 2/2009 | Shalvi et al. |
| 2009/0046507 A1 | 2/2009 | Aritome |
| 2009/0072303 A9 | 3/2009 | Prall et al. |
| 2009/0091979 A1 | 4/2009 | Shalvi |
| 2009/0103358 A1 | 4/2009 | Sommer et al. |
| 2009/0106485 A1 | 4/2009 | Anholt |
| 2009/0113275 A1 | 4/2009 | Chen et al. |
| 2009/0125671 A1 | 5/2009 | Flynn |
| 2009/0132755 A1 | 5/2009 | Radke |
| 2009/0144598 A1 | 6/2009 | Yoon |
| 2009/0144600 A1 | 6/2009 | Perlmutter et al. |
| 2009/0150599 A1 | 6/2009 | Bennett |
| 2009/0150748 A1 | 6/2009 | Egner et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2009/0282185 A1 | 11/2009 | Van Cauwenbergh |
| 2009/0282186 A1 | 11/2009 | Mokhlesi et al. |
| 2009/0287930 A1 | 11/2009 | Nagaraja |
| 2009/0300269 A1 | 12/2009 | Radke et al. |
| 2009/0323942 A1 | 12/2009 | Sharon |
| 2010/0005270 A1 | 1/2010 | Jiang |
| 2010/0025811 A1 | 2/2010 | Bronner et al. |
| 2010/0030944 A1 | 2/2010 | Hinz |
| 2010/0058146 A1 | 3/2010 | Weingarten et al. |
| 2010/0064096 A1 | 3/2010 | Weingarten et al. |
| 2010/0088557 A1 | 4/2010 | Weingarten et al. |
| 2010/0091535 A1 | 4/2010 | Sommer et al. |
| 2010/0095186 A1 | 4/2010 | Weingarten |
| 2010/0110787 A1 | 5/2010 | Shalvi et al. |
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0149881 A1 | 6/2010 | Lee et al. |
| 2010/0172179 A1 | 7/2010 | Gorobets et al. |
| 2010/0174853 A1 | 7/2010 | Lee |
| 2010/0180073 A1 | 7/2010 | Weingarten et al. |
| 2010/0199149 A1 | 8/2010 | Weingarten et al. |
| 2010/0211724 A1 | 8/2010 | Weingarten |
| 2010/0211833 A1 | 8/2010 | Weingarten |
| 2010/0211856 A1 | 8/2010 | Weingarten |
| 2010/0241793 A1 | 9/2010 | Sugimoto |
| 2010/0246265 A1 | 9/2010 | Moschiano et al. |
| 2010/0251066 A1 | 9/2010 | Radke |
| 2010/0253555 A1 | 10/2010 | Weingarten et al. |
| 2010/0257309 A1 | 10/2010 | Barsky et al. |
| 2010/0269008 A1 | 10/2010 | Leggette |
| 2010/0293321 A1 | 11/2010 | Weingarten |
| 2010/0318724 A1 | 12/2010 | Yeh |
| 2011/0040924 A1* | 2/2011 | Selinger ....................... 711/103 |
| 2011/0041005 A1* | 2/2011 | Selinger ........................... 714/6 |
| 2011/0041039 A1* | 2/2011 | Harari et al. .................. 714/773 |
| 2011/0051521 A1 | 3/2011 | Levy et al. |
| 2011/0055461 A1 | 3/2011 | Steiner et al. |
| 2011/0093650 A1 | 4/2011 | Kwon et al. |
| 2011/0096612 A1 | 4/2011 | Steiner et al. |
| 2011/0099460 A1 | 4/2011 | Dusija et al. |
| 2011/0119562 A1 | 5/2011 | Steiner et al. |
| 2011/0153919 A1 | 6/2011 | Sabbag |
| 2011/0161775 A1 | 6/2011 | Weingarten |
| 2011/0194353 A1* | 8/2011 | Hwang et al. ........... 365/185.19 |
| 2011/0209028 A1 | 8/2011 | Post |
| 2011/0214029 A1 | 9/2011 | Steiner et al. |
| 2011/0214039 A1 | 9/2011 | Steiner et al. |
| 2011/0246792 A1 | 10/2011 | Weingarten |
| 2011/0246852 A1 | 10/2011 | Sabbag |

(56) References Cited

U.S. PATENT DOCUMENTS

| | | |
|---|---|---|
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0302428 A1 | 12/2011 | Weingarten |
| 2012/0001778 A1 | 1/2012 | Steiner et al. |
| 2012/0005554 A1 | 1/2012 | Steiner et al. |
| 2012/0005558 A1 | 1/2012 | Steiner et al. |
| 2012/0005560 A1 | 1/2012 | Steiner et al. |
| 2012/0008401 A1 | 1/2012 | Katz et al. |
| 2012/0008414 A1 | 1/2012 | Katz et al. |
| 2012/0017136 A1 | 1/2012 | Ordentlich et al. |
| 2012/0051144 A1 | 3/2012 | Weingarten et al. |
| 2012/0063227 A1 | 3/2012 | Weingarten et al. |
| 2012/0066441 A1 | 3/2012 | Weingarten |
| 2012/0110250 A1 | 5/2012 | Sabbag et al. |
| 2012/0124273 A1 | 5/2012 | Goss et al. |
| 2012/0246391 A1 | 9/2012 | Meir |
| 2012/0294094 A1* | 11/2012 | Ling et al. ............... 365/189.02 |
| 2012/0294100 A1* | 11/2012 | Ling et al. ..................... 365/200 |
| 2013/0314992 A1* | 11/2013 | Takagiwa ................. 365/185.09 |
| 2013/0329494 A1* | 12/2013 | Shirakawa ............... 365/185.09 |
| 2014/0250348 A1* | 9/2014 | Harari et al. ................. 714/773 |

OTHER PUBLICATIONS

Search Report of PCT Patent Application WO 2009/118720 A3, Mar 4, 2010.
Search Report of PCT Patent Application WO 2009/095902 A3, Mar 4, 2010.
Search Report of PCT Patent Application WO 2009/078006 A3, Mar 4, 2010.
Search Report of PCT Patent Application WO 2009/074979 A3, Mar 4, 2010.
Search Report of PCT Patent Application WO 2009/074978 A3, Mar 4, 2010.
Search Report of PCT Patent Application WO 2009/072105 A3, Mar 4, 2010.
Search Report of PCT Patent Application WO 2009/072104 A3, Mar 4, 2010.
Search Report of PCT Patent Application WO 2009/072103 A3, Mar 4, 2010.
Search Report of PCT Patent Application WO 2009/072102 A3, Mar 4, 2010.
Search Report of PCT Patent Application WO 2009/072101 A3, Mar 4, 2010.
Search Report of PCT Patent Application WO 2009/072100 A3, Mar 4, 2010.
Search Report of PCT Patent Application WO 2009/053963 A3, Mar 4, 2010.
Search Report of PCT Patent Application WO 2009/053962 A3, Mar 4, 2010.
Search Report of PCT Patent Application WO 2009/053961 A3, Mar 4, 2010.
Search Report of PCT Patent Application WO 2009/037697 A3, Mar 4, 2010.
Yani Chen, Kcshab K. Parhi, "Small Area Parallel Chien Search Architectures for Long BCH Codes", IEEE Transactions on Very Large Scale Integration(VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol. 2, pp. II-369-II-372 vol. 2.
Michael Purser, "Introduction to Error Correcting Codes", Artech House Inc., 1995.
Ron M. Roth, "Introduction to Coding Theory", Cambridge University Press, 2006.
Akash Kumar, Sergei Sawitzki, "High-Throughput and Low Power Architectures for Reed Solomon Decoder", (a.kumar at tue.nl, Eindhoven University of Technology and sergei.sawitzki at philips.com), Oct. 2005.
Todd K.Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programming Speed and Current Absorption in Flash Memories with the Ramped-Gate Programming Technique", Ieee Transactions on Electron Devices, vol. 47, No. 4, Apr. 2000.
Giovanni Campardo, Rino Micheloni, David Novosel, "VLSI-Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Memory: Threshold Voltage Built in Self Diagnosis", ITC International Test Conference, Paper 2.1, Feb. 2005.
J.M. Portal, H. Aziza, D. Nee, "EEPROM Diagnosis Based on Threshold Voltage Embedded Measurement", Journal of Electronic Testing: Theory and Applications 21, 33-42, 2005.
G. Tao, A. Scarpa, J. J Dijkstra, W. Stidl, F. Kuper, "Data retention prediction for modern floating gate non-volatile memories", Microelectronics Reliability 40 (2000), 1561-1566.
T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash EEPROM Devices", Proc. IEEE 1995 Int. Conference on Microelectronics Test Structures, vol. 8, Mar. 1995.
Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar, Eduardo Maayan, "4-bit per Cell NROM Reliability", Appears on the website of Saifun.com , 2005.
Paulo Cappelletti, Clara Golla, Piero Olivo, Enrico Zanoni, "Flash Memories", Kluwer Academic Publishers, 1999.
JEDEC Standard, "Stress-Test-Driven Qualification of Integrated Circuits", JEDEC Solid State Technology Association. JEDEC Standard No. 47F pp. 1-26, Dec. 2007.
Dempster, et al., "Maximum Likelihood from Incomplete Data via the EM Algorithm", Journal of the Royal Statistical Society. Series B (Methodological), vol. 39, No. 1 (1997), pp. 1-38.
Mielke, et al., "Flash EEPROM Threshold Instabilities due to Charge Trapping During Program/Erase Cycling", IEEE Transactions on Device and Materials Reliability, vol. 4, No. 3, Sep. 2004, pp. 335-344.
Daneshbeh, "Bit Serial Systolic Architectures for Multiplicative Inversion and Division over GF (2)", A thesis presented to the University of Waterloo, Ontario, Canada, 2005, pp. 1-118.
Chen, Formulas for the solutions of Quadratic Equations over GF (2), IEEE Trans. Inform. Theory, vol. IT-28, No. 5, Sep. 1982, pp. 792-794.
Berlekamp et al., "On the Solution of Algebraic Equations over Finite Fields", Inform. Cont. 10, Oct. 1967, pp. 553-564.

* cited by examiner

Sending input data to a NAND flash memory unit that the NAND flash memory array and instructing the NAND flash memory unit to write input data to the NAND flash memory array to provide programmed data. 410

Reading from the NAND flash memory array the programmed data to provide read data. 420

Comparing the input data and the read data to provide column errors statistics at a column resolution. 430

Defining, by a control circuit, bad columns of the NAND flash memory array in response to the column error statistics. 440

Responding to the definition of bad columns. 450

Defining an encoding scheme for data units to be written to the NAND flash memory array while constraining a value of bits to be written to the bad columns to be of an erase value. 452

Defining a mapping of bits of codewords to flash memory cells of the NAND flash memory unit in response to locations of the bad columns. 456

Determining an encoding parameter in response to the column error statistics. 458

Receiving, by the control circuit, an input data unit to be written to the NAND flash memory array; generating, by the control circuit, an updated data unit by adding dummy bits to the input data unit at locations that are expected to be written to bad columns of the NAND flash memory array; sending the updated data unit to the NAND flash memory unit and instructing the NAND flash memory unit to write the updated data unit to the NAND flash memory array. 454

DETECTING AND MANAGING BAD COLUMNS

CROSS REFERENCE TO RELATED APPLICATIONS

This application relates to a concurrently filed and co-pending U.S. patent application Ser. No. 14/050,264, entitled "Detecting and Managing Bad Columns" by Amir Nassie, owned by the assignee of this application and incorporated by reference herein in its entirety.

BACKGROUND OF THE INVENTION

Nonvolatile flash memory devices store information in the form of charge in a flash memory cell. A flash memory cell has a CMOS transistor with an additional floating metal gate between the substrate and the transistors gate. The charge is stored in the floating gate and is injected to the floating gate during an operation known as programming. The charge may be removed during an operation known as an erase operation.

As the charge in the floating gate may vary contiguously, it is possible to store more than just one bit per flash transistor by using several charge levels to symbolize different sequences of bits.

FIG. 1 demonstrates a voltage level distribution for a 3 bpc (bits per cell) flash memory cell. The voltage level distribution includes eight lobes 101-108. Each lobe represents a 3-bit value.

The voltage level distributions of FIG. 1 illustrates non-overlapping lobes, however this is only schematic, and in practical cases the lobes may overlap. The reason for overlapping may be intentional for obtaining high programming speed, or due to the retention effect. For floating gate devices, an "old" page, may introduce greater overlap between lobes than a new page, since after many program/erase (P/E) cycles there is accumulated trap charge, which is de-trapped over time. After a long duration, every lobe may have a larger standard deviation (std) and may have a different mean location. These effects are also known as retention.

The 3 bpc cell includes a most significant bit (MSB), a central significant bit (CSB) and a least significant bit (LSB). A physical page of flash memory module may store three logical pages. This physical page is programmed one logical page after the other. The programming includes various types of programming such as MSB programming (in which some of the cells are programmed to a single lobe and some are left in the erase state. At the end of this programming process only two lobes exists, the erase and the MSB lobes), a CSB programming (in which the erase lobe and the MSB lobe are each split into two lobes by further programming pulses, depending on the original state of each cell and the corresponding CSB bit. At the end of this step there are four lobes.) and a LSB programming (in which each of the four lobes is further split to create 8 lobes, overall). The logical pages are read by applying various types of read operations such as MSB read (in which a MSB threshold 114 is used), CSB read (in which two CSB thresholds 112 and 116 are used) and LSB read (in which four LSB thresholds 111, 113, 115 and 117 are used). FIG. 2 shows similar distributions for the case of 2 bpc devices.

A NAND Flash array (or block) is constructed from NAND Flash memory cells. The NAND Flash memory cells are grouped into columns (or strings). FIG. 3 shows a typical prior art portion 30 of a NAND flash memory array that includes thirty two lines (wordlines 31(1)-32(32)) and multiple (Q) columns (32(1)-32(Q)). Once column 32(q) is illustrated in further details—it shows the thirty two flash memory cells 34(q) of the column, bit line select transistor and ground select transistor, and the voltages 33(q) supplied to the transistors and flash memory cells (Bit Line Select, Vbias, Vth). Column 32(q) is connected to sense amplifier 35(q), that in turn is connected to latch 36(q). A string (column) is duplicated many times (for example Q=34560 times) in a block and includes several (for example—thirty two) flash memory cells. Each of the flash memory cells is associated with a different wordline (or row) which connects all of the corresponding cells in the other strings of the block. When a block is chosen, each string is connected to a corresponding bitline by turning on the Bit Line Select and the Ground Select transistors. When a read operation is performed, a sense amplifier is connected to the bit-line and after allowing some time (say 25 uS) for the bit-line voltage to settle, the result is stored by a latch.

In order to measure the charge in a certain cell within a string, all other cells are switched on by applying a high voltage on their gates (given by Vbias) and a comparison voltage, Vth, is applied to the gate of the selected cell. If the cell is charged and Vth is not high enough, the gate will not allow current to flow and the sense-amplifier will output a "O". On the other hand, if the cell is not charge or Vth is high enough, current will flow and the sense-amplifier will output a "1". Different schemes may exist where the cell being sampled is biased with a constant voltage (say Vee) but in the sense-amplifier a comparison against a reference string is performed which reference value may be determined by some external voltage, Vth.

The above sampling technique holds when a bit may be obtained only through a single threshold comparison. When more than a single threshold comparison is required, the above procedure may be performed for each threshold and the results may then be combined. Alternatively, several sense-amplifiers may be used simultaneously, each one compares against a different threshold, and the results are then combined to yield the required bit value.

All cells in a wordline (physical page) are programmed simultaneously and read simultaneously. In case of MLC or TLC, the programming of a wordline is divided into two or three stages, referred to as MSB, CSB and LSB page programming stages.

Due to manufacturing defects, some of the columns may not operate properly. In that case, NAND manufacturers, allocate spare strings which are used to replace the defective strings. The replacement is done during the manufacturing process, where the bad columns are detected and internal circuitry is used to remap the spare strings to replace. Typically, the replacement is not very efficient as entire bytes or words (16 bits) are replaced even if a single column was bad. That is, the columns are divided into chunks of 8 or 16 columns and the replacement is done on an entire chunk.

Alternatively, some manufacturers do not replace the bad columns and leave the task to the memory controller that controls the NAND Flash. That is, more strings are allocated on a NAND array to allow some spare strings for replacement. However, the replacements are not done at the NAND array level but rather, bad columns are handled by the controller instead.

SUMMARY

A method, a system, and a non-transitory computer readable medium are provided for detecting and managing bad columns of a NAND flash memory array.

According to an embodiment of the invention a method may be provided for detecting bad columns of a NAND flash memory array, the method may include sending input data to a NAND flash memory unit that may include the NAND flash memory array and instructing the NAND flash memory unit to write input data to the NAND flash memory array to provide programmed data; reading from the NAND flash memory array the programmed data to provide read data; comparing the input data and the read data to provide column error statistics at a column resolution; and defining, by a flash memory controller, bad columns of the NAND flash memory array in response to the column error statistics.

The column error statistics may be indicative of a number of errors per column, and the defining of the bad columns may include defining a column of the NAND flash memory array as a bad column if a number of errors associated with the column may exceed an error threshold.

The column error statistics may be indicative of a number of errors per column and wherein the method may include may include assigning a reliability score per each column in response to a number of errors associated with the column.

The method may include defining an encoding scheme for data units to be written to the NAND flash memory array while constraining a value of bits to be written to the bad columns to be of an erase value.

The method may include receiving, by the flash memory controller, an input data unit to be written to the NAND flash memory array; generating, by the flash memory controller, an updated data unit by adding dummy bits to the input data unit at locations that are expected to be written to bad columns of the NAND flash memory array; and sending the updated data unit to the NAND flash memory unit and instructing the NAND flash memory unit to write the updated data unit to the NAND flash memory array.

A value of a dummy bit to be written, instead a data bit; to a flash memory cell of a bad column equals a value of the data bit.

The method may include defining a mapping of bits of codewords to flash memory cells of the NAND flash memory unit in response to locations of the bad columns.

The defining of the mapping reduces an effect of an uneven distribution of bad columns within NAND flash memory unit portions allocated for storing the codewords.

The mapping of bits of a codeword of the codewords may be further responsive to a relationship between (a) a size of a NAND flash memory unit portion allocated for storing the codeword, and (b) a sum of (i) a size of the codeword and (ii) a number of flash memory cells that belong to a bad column within the NAND flash memory unit portion allocated for storing the codeword.

The method may include swapping bits that belong to different codewords in response to an amount of bad columns and to a location of bad columns in NAND flash memory units portions initially allocated for storing the different codewords.

The method may include determining an encoding parameter in response to the column error statistics.

The encoding parameter may be a bit error rate of a code to be used for providing codewords.

The encoding parameter may be a number of redundancy bits to be allocated per codeword.

The number of redundancy bits may be determined to optimize a value of a function of (a) bad column distribution between different dies of the NAND flash memory unit and (b) a bit error rate function.

The determining may be responsive to column error statistics of different dies of NAND flash memory unit that are activated at a certain point in time.

The encoding parameter may be a bit error rate of a code to be used for providing codewords.

The flash memory array may be spread over multiple dies of the flash memory unit.

According to an embodiment of the invention there may be provided a non-transitory computer readable medium that may store instructions to be executed by a computer and cause the computer to perform stages may include: instructing a NAND flash memory unit that may include a NAND flash memory array to write input data to the NAND flash memory array to provide programmed data; reading from the NAND flash memory array the programmed data to provide read data; comparing the input data and the read data to provide column error statistics at a column resolution; and defining, by a control circuit, bad columns of the NAND flash memory array in response to the column error statistics.

A system, may include a flash memory controller that may include a control circuit and an interface; wherein the interface may be arranged to a instruct a NAND flash memory unit that may include a NAND flash memory array to write input data to the NAND flash memory array to provide programmed data; wherein the interface may be arranged to read from the NAND flash memory array the programmed data to provide read data; wherein the control circuit may be arranged to compare the input data and the read data to provide column error statistics at a column resolution; and define bad columns of the NAND flash memory array in response to the column error statistics.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 4 illustrates a method according to an embodiment of the invention;

Figure 1:
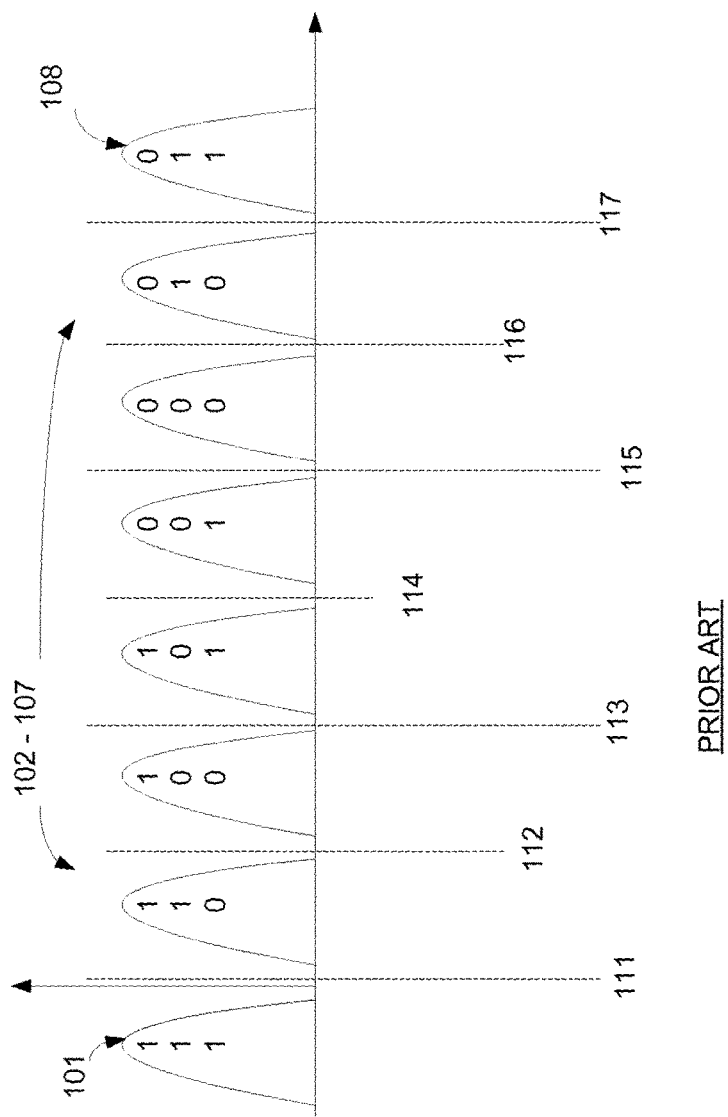
FIG. 1 illustrates a prior art voltage threshold distribution.
Figure 2:
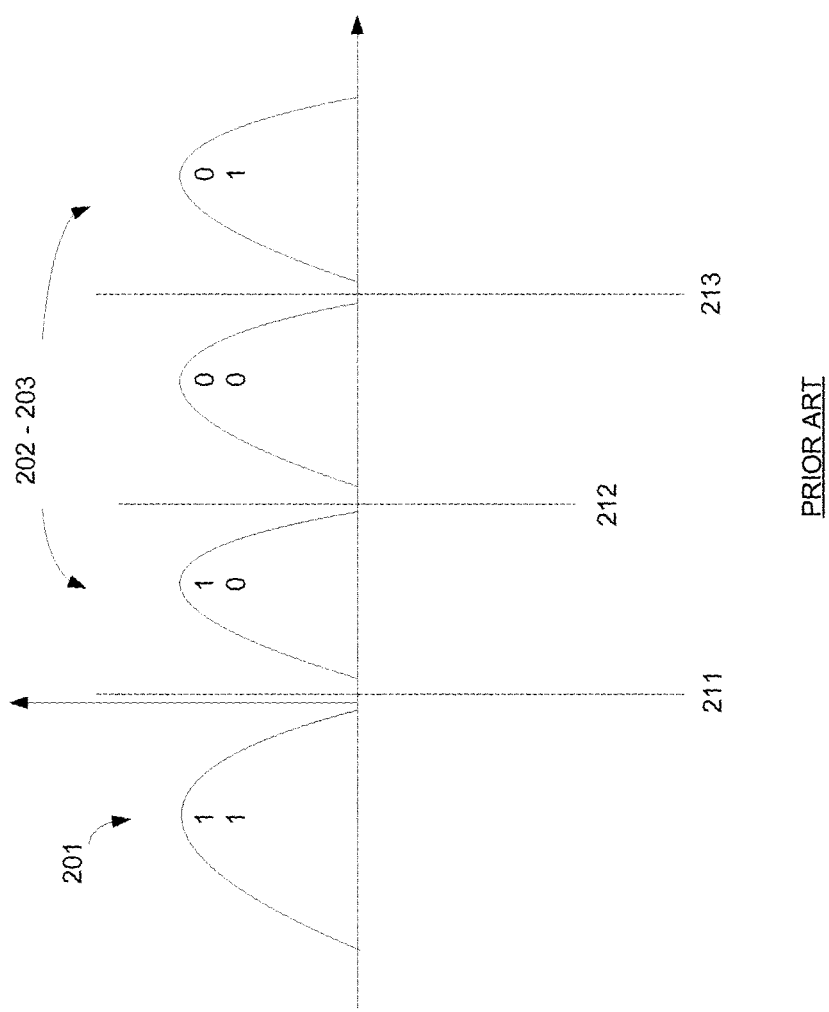
FIG. 2 illustrates a prior art voltage threshold distribution.
Figure 3:
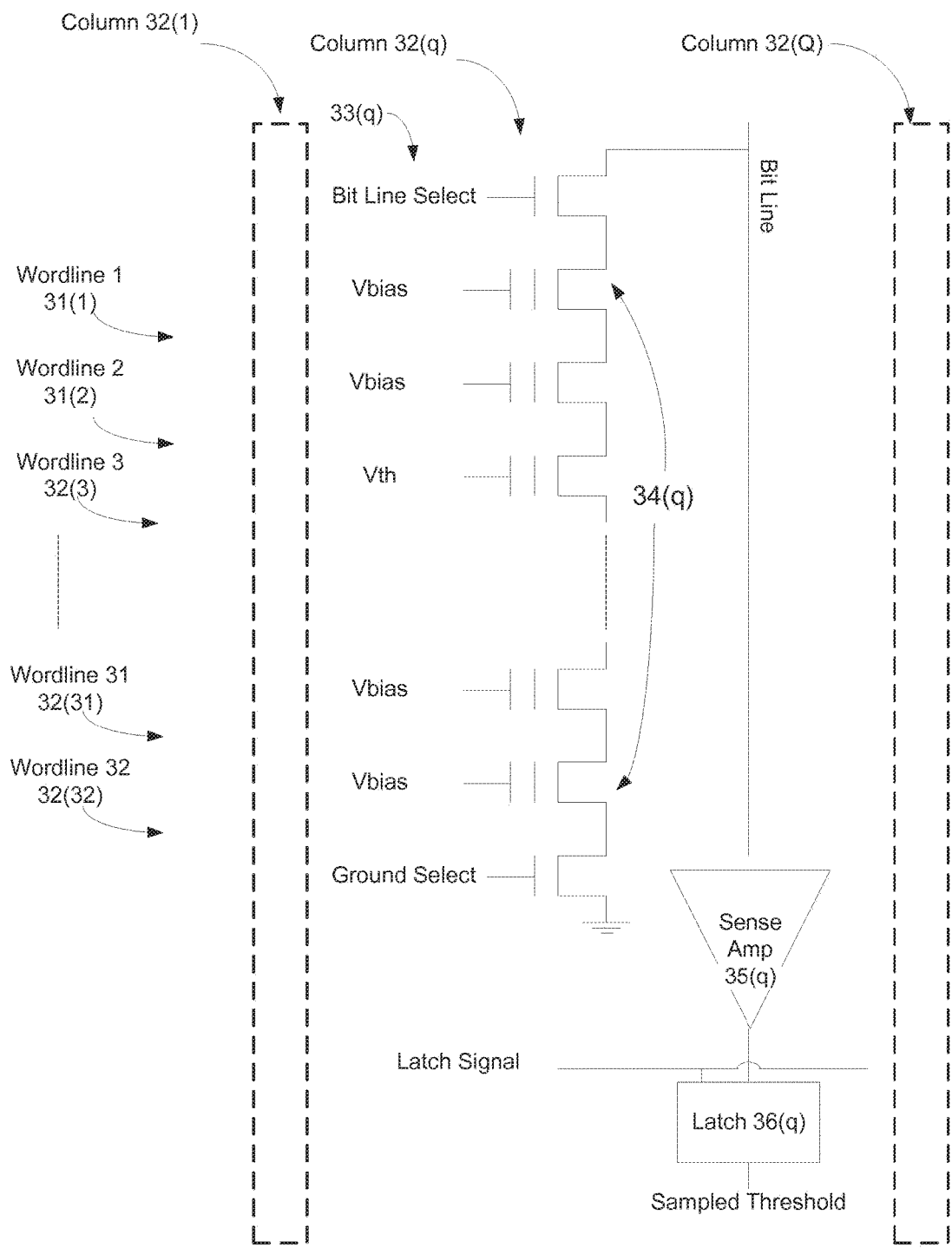
FIG. 3 illustrates a prior art portion of a NAND flash memory array.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE DRAWINGS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that may be executed by the system and should be applied mutatis mutandis to a non-transitory computer readable medium that stores instructions that may be executed by the system.

Any reference in the specification to a non-transitory computer readable medium should be applied mutatis mutandis to a system capable of executing the instructions stored in the non-transitory computer readable medium and should be applied mutatis mutandis to method that may be executed by a computer that reads the instructions stored in the non-transitory computer readable medium.

There are provided systems, methods and computer readable media for managing bad columns at a column resolution (on a column to column basis).

The term "controller" refers to a flash memory controller.

The term data unit refers to multiple data bits of any size. The data unit can included encoded data bit, decoded data bits or any type of data bits. A data unit can include a byte, a word, a page and the like. In some of the examples (for example—FIGS. 8-10) there is a reference of reading and writing words of a page. It is noted that this is just an example of data units.

The following description describes: (a) a scheme for detecting bad columns and how this information may be used during the decoding process; (b) two bad column replacement schemes; (c) a hardware design to implement one of the bad column replacement scheme; (d) spreading the bad columns across several codewords to reduce a possible uneven distribution of bad columns in portions of a NAND flash memory array allocated for storing the codewords; (e) and how code parameters may be designed modified to handle bad columns and consider the probability of their occurrence.

Bad Columns Detection

Some NAND flash units that do not replace the bad columns internally, allow the controller to read back the chunk location (byte/word) of each bad column.

However, this has two drawbacks. First, there is no distinction between one column and another within the chunk and thus all columns are discarded (bad or good). Secondly, there is no distinction in the severity of how bad is the column. It may be that some columns are declared bad but that is because they are more prone to errors. Such columns may still be used for carrying data but may be given lesser reliability.

Therefore, there is provided an alternative method for detecting bad columns. An erase block is programmed with random data and the its content is read back. The programmed data is then compared to the data read back and a page sized vector (i.e. number of values is equivalent to the number of columns in a page) is used to count the number of errors that were detected per each column.

As an example consider a TLC device where each block has 64 rows and 192 pages. To create this vectors we nullify it at first and for each page being read, we compare it to the original data and add 1's to the vector at the locations corresponding to the error location.

We can then detect bad columns rather easily. We set a threshold (e.g. 20, in the previous example) such that if the vectors contain a value higher than that, the column is declared bad. For TLC devices, we can also do that for each page type separately by creating 3 such sum vectors and repeating the procedure above per page, using a different vector, depending on the page type.

Note that we can also obtain more refined information than just if the column was bad or not. The value of the vector may be used as a reliability indicator for a decoder. For example, returning to the example above: a block with 192 pages. The reliability indicator may be defined as the ratio $LLR=Log(value/(192-value))$. This can then be used in conjunction with an LDPC code or any other coding scheme which decoder can make use of such log likelihood ratios.

Such information can also be used in conjunction with coding schemes which decoder allows decoding inputs with erasures. That is a decoding scheme which obtains per each bit 3 values: 0, 1 and Erasure. All columns which LLR above was between two given values can be assigned the Erasure value and the others 0 or 1, depending on the read value. BCH codes can also be decoded using erasure information. Other codes are LDPC, turbo-codes and more.

FIG. 4 illustrates method 400 according to an embodiment of the invention.

The method is for detecting bad columns of a NAND flash memory array.

Method 400 may start by stage 410 of sending input data to a NAND flash memory unit that may include the NAND flash memory array and instructing the NAND flash memory unit to write input data to the NAND flash memory array to provide programmed data.

Stage 410 may be followed by stage 420 of reading from the NAND flash memory array the programmed data to provide read data.

Stage 420 may be followed by stage 430 of comparing the input data and the read data to provide column errors statistics at a column resolution. The column error statistics provide information on the number of errors per column. An error is detected as a mismatch between a value of an input data bit and a corresponding read data bit. The mismatch is associated with a column that includes the flash memory cell that stored the programmed data bit that corresponds to the bad data bit and the input data bit.

Stage 430 may be followed by stage 440 of defining, by a flash memory controller, bad columns of the NAND flash memory array in response to the column error statistics.

The column error statistics may be indicative of a number of errors per column. Stage 440 may include defining a column of the NAND flash memory array as a bad column if a number of errors associated with the column exceed an error threshold.

The column errors statistics is indicative of a number of errors per column and stage 440 may include assigning a reliability score per each column in response to a number of errors associated with the column. This reliability score can be used when determining what to program to flash memory cells of a bad column, when determining data reconstruction schemes and the like.

Stage 440 may be followed by stage 450 of responding to the definition of bad columns.

The responding may include applying any of the schemes disclosed in this application including, for example, determining encoding parameters, bit skipping, bit replacement, bad column spreading schemes or any bad column replacement schemes.

Stage 450 may include at least one out of stages 452, 454, 456 and 458.

Stage 452 may include defining an encoding scheme for data units to be written to the NAND flash memory array while constraining a value of bits to be written to the bad columns to be of an erase value.

Stage 454 may include bit skipping—receiving, by the flash memory controller, an input data unit to be written to the NAND flash memory array; generating, by the flash memory controller, an updated data unit by adding dummy bits to the input data unit at locations that are expected to be written to bad columns of the NAND flash memory array; and sending the updated data unit to the NAND flash memory unit and instructing the NAND flash memory unit to write the updated data unit to the NAND flash memory array. The value of a dummy bit to be written, instead a data bit; to a flash memory cell of a bad column equals a value of the data bit.

Stage 456 may include a bad column spreading scheme—defining a mapping of bits of codewords to flash memory cells of the NAND flash memory unit in response to locations of the bad columns.

The defining of the mapping reduces an effect of an uneven distribution of bad columns within NAND flash memory unit portions allocated for storing the codewords.

The mapping of bits of a codeword, is further responsive to a relationship between (a) a size (S1) of a NAND flash memory unit portion allocated for storing the codeword, and (b) a sum of (i) a size (S2) of the codeword and (ii) a number (N1) of flash memory cells that belong to a bad column within the NAND flash memory unit portion allocated for storing the codeword.

If S1>S2+N1 there may not be a need to perform spreading and the entire codeword can be written only to flash memory cells of good columns. Nevertheless—S1−(S2+N1) flash memory cells may be programmed with stuffing bits.

If S1>S2+N1 then some bits may be lost.

Stage 456 may include swapping bits that belong to different codewords in response to an amount of bad columns and to a location of bad columns in NAND flash memory units portions initially allocated for storing the different codewords.

Stage 458 may include determining an encoding parameter in response to the column error statistics.

The encoding parameter may be a bit error rate of a code to be used for providing codewords. These codewords may be represented by one or more input data units.

The encoding parameter may be a number of redundancy bits to be allocated per codeword.

The number of redundancy bits may be determined to optimize a value of a function of (a) bad column distribution between different dies of the NAND flash memory unit and (b) a bit error rate function.

The determining may be responsive to column error statistics of different dies of NAND flash memory unit that are activated at a certain point in time.

Bad Columns Replacement Schemes

Another method of handling bad columns is not using them. This is generally supported by column replacement operation within the NAND Flash devices. However, as mentioned this replacement operation is rather coarse and works on entire chunks instead of a single string.

According to an embodiment of the invention it may be desirable to perform the replacement in a controller at the bit level. In general, before programming data into the NAND, codewords may be aggregated inside the NAND Flash controller until sufficient data is available to program a full NAND page. The NAND page data is the transferred to the NAND device through a NAND interface (NI) in the controller (see FIG. 5). According to an embodiment of the invention it may be desirable to modify the NAND interface unit in the NAND controller such that the NI unit (NI) performs the required bitwise replacement operation.

Note that the NI works by transferring the data byte by byte or word by word. The NAND device is unaware of the fact that there are bad columns or of the content of the data. Any of the replacement operations are performed by the NI without modifying the standard operation of the NAND device.

Bit Skipping

Figure 6:
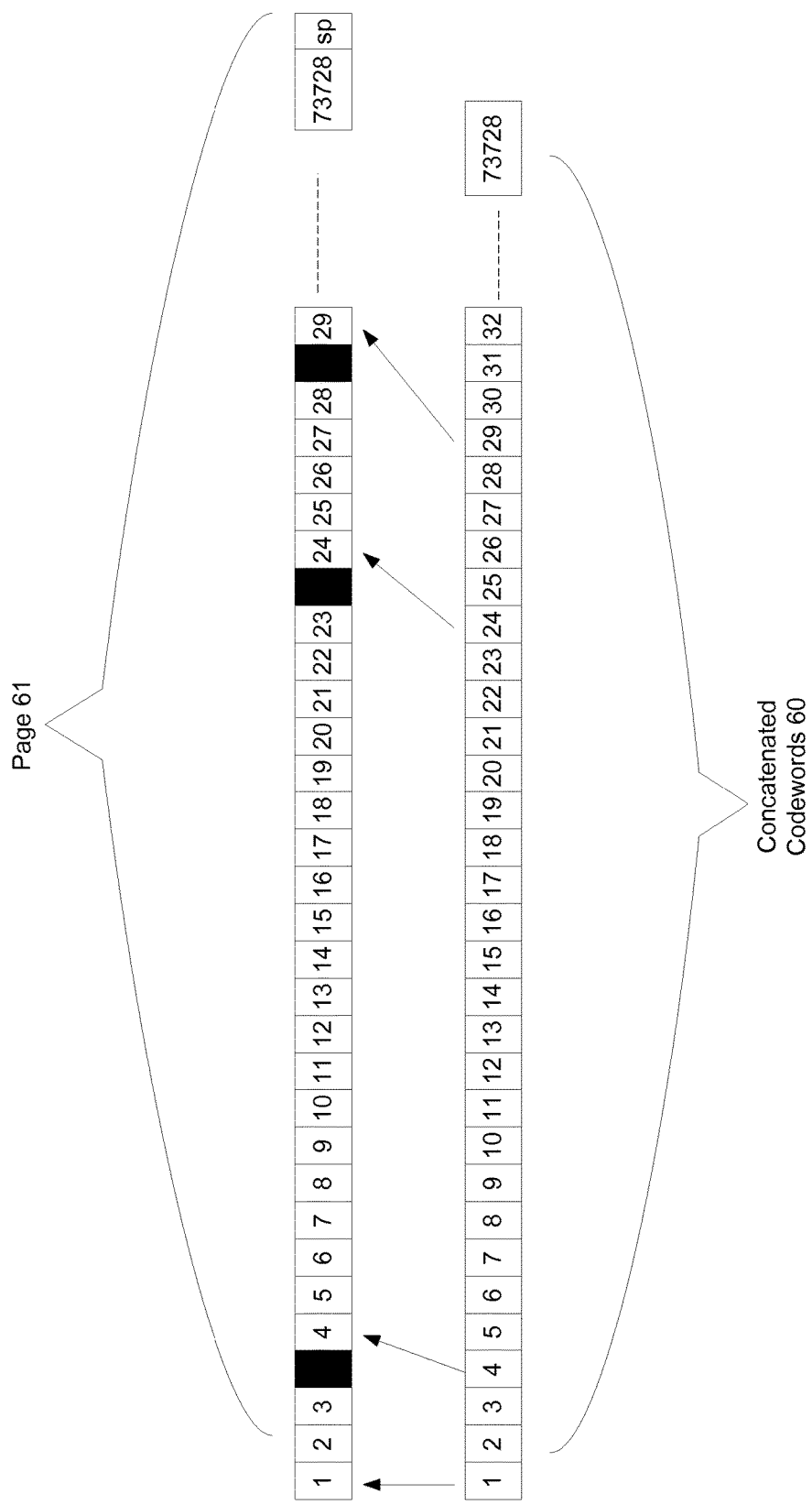
FIG. 6 illustrates an input data unit and an updated data unit generated by applying a bit skipping scheme according to an embodiment of the invention.

While sending the aggregated codewords to the NAND Flash, the NI unit is loaded with the list of all bad columns in the NAND Flash die. Each time a bit is going to be written to a bad column, a dummy bit is inserted in place of the original data and the original bit stream from that point on is shifted by one bit. Thus, the original data is not written to bad columns. Similarly, when reading data from the NAND, each time a bad column is encountered, the corresponding bit is overrun with the next bit being read. All the following bits are shifted to replace the columns being overrun. FIG. 6 shows an example of a mapping between a concatenated codeword 60 and the physical page 61.

Note that throughout we assume that the amount of data in the concatenated codewords is less than in the physical page, to make room for bad columns. However, there may be two cases that need to be taken into account:

Case one—the amount of bits in the concatenated codewords+the number of bad columns is still smaller than the physical page size. In that case, during the programming operation, additional dummy bits are inserted (e.g. zeros) at the end of the stream to complete it to a physical page size.

Case two—the amount of bits in the concatenated codewords+the number of bad columns is still greater than the physical page size. In that case, during programming the data bits which over-run the page are truncated. During the read operation missing data, bits are padded with zeros, causing some errors in those bits.

Whether case one or case two are relevant depend on the size of the codeword redundancy and the number of bad columns. The codeword redundancy can be chosen by the designer of the NAND Flash controller. However, the number of bad columns in a NAND device is random and changes between one device and another. The manufacturer guaranties that the maximum number of bad columns will not exceed a certain maximum but this is typically much larger than the actual number of bad columns. Therefore, the size of the redundancy may be chosen as a function of the distribution of bad columns.

Another note on the choice of the dummy bits: the dummy bit may be chosen to have the value of the original bit intended to be written to the bad column. If a bad column is not completely bad, the read information from that bit can be used to obtain additional information and increase reliability.

Bit Replacement

Bit skipping may be difficult to implement in hardware as the streaming data becomes unaligned with the standard units of bytes/words/double words. This alignment is important as it eases the job of parallelizing in streamlining the operation of the unit.

Therefore, in the following we present a hardware implementation of a unit that does not perform bit skipping but rather bit replacement. In this scheme, data bits that fall on bad columns are copied into a spare register, which then appended to the data stream and programmed last to the NAND page. During read, the last bytes, which contain the spare register, are read first.

Under some cases, the read operation may first be attempted without reading the spare register. In that case, the information that was read from the bad columns can be used. Only upon decoding failure we may choose to read the spare register bits. The cases that may be of interest are those where data is being read from random location which will cause the NI unit to take longer time to read, if it needs to perform replacement.

Hardware Implementation

Figure 5:
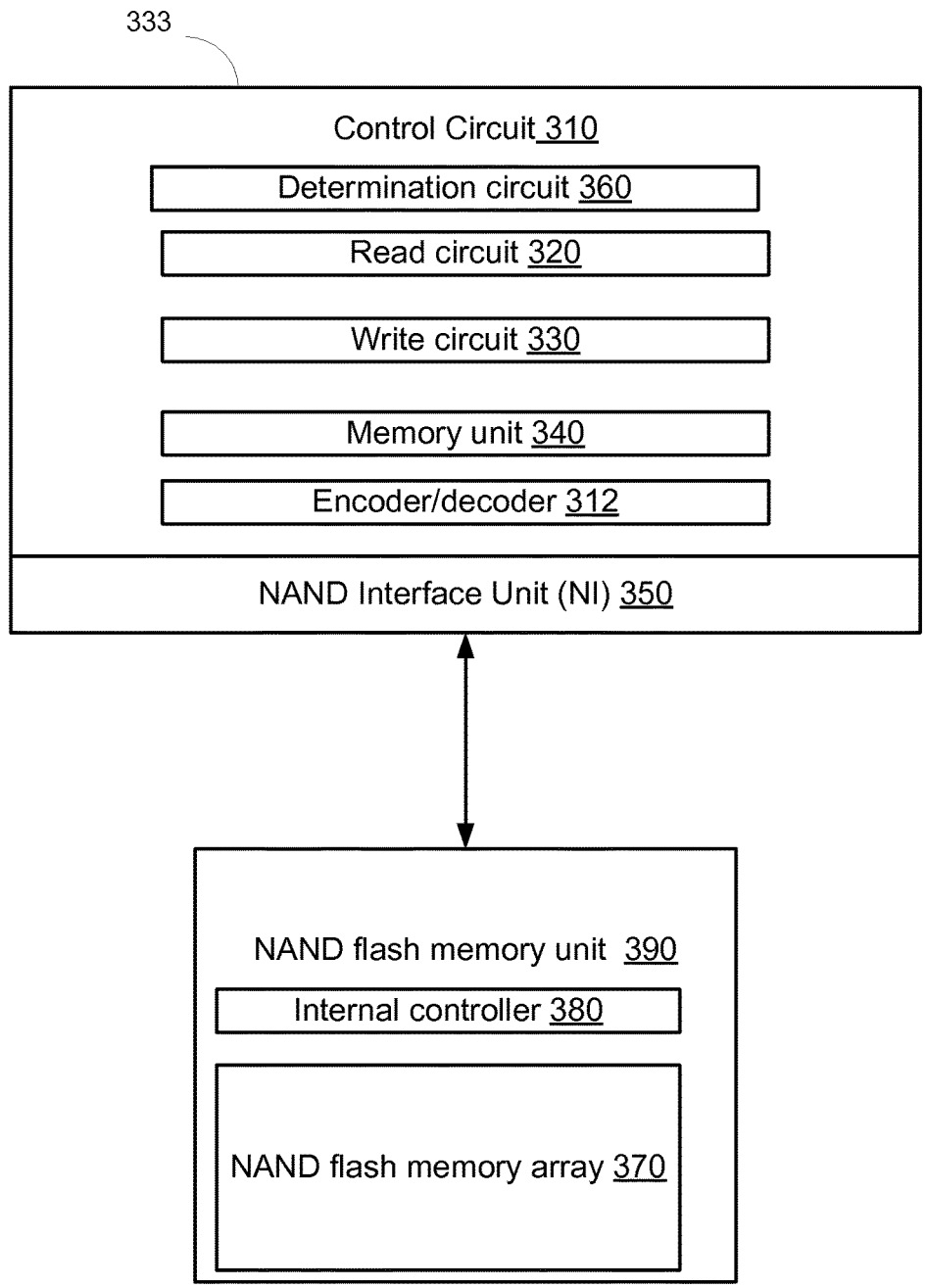
FIG. 5 illustrates a system according to an embodiment of the invention.

FIG. 5 illustrates system 300 according to an embodiment of the invention. It may include flash memory controller 333 and NAND flash memory unit 390. The flash memory controller 333 may include a control circuit 310 and a NAND interface unit (NI) 350. The control circuit 310 may include encoder/decoder 312, a read circuit 320, write circuit 330, a determination circuit 360, and a memory unit 340.

The NAND flash memory unit 390 includes an internal controller 380 and NAND flash memory array 370. It may include multiple arrays, one or more flash memory dies, one or more planes, and the like. The internal controller 380 may program data to the NAND flash memory array 370, may read data from the NAND flash memory array 370 and may erase the NAND flash memory array 370—under the control of instructions sent from the flash memory controller 333 (via NU 350).

The determination circuit 360 may receive or generate column error statistics may determine how to respond to column error statistics, may determine an encoding scheme and the like. Encoder/decoder 312 may encode and/or decode data, append redundancy bits and the like.

Figure 8:
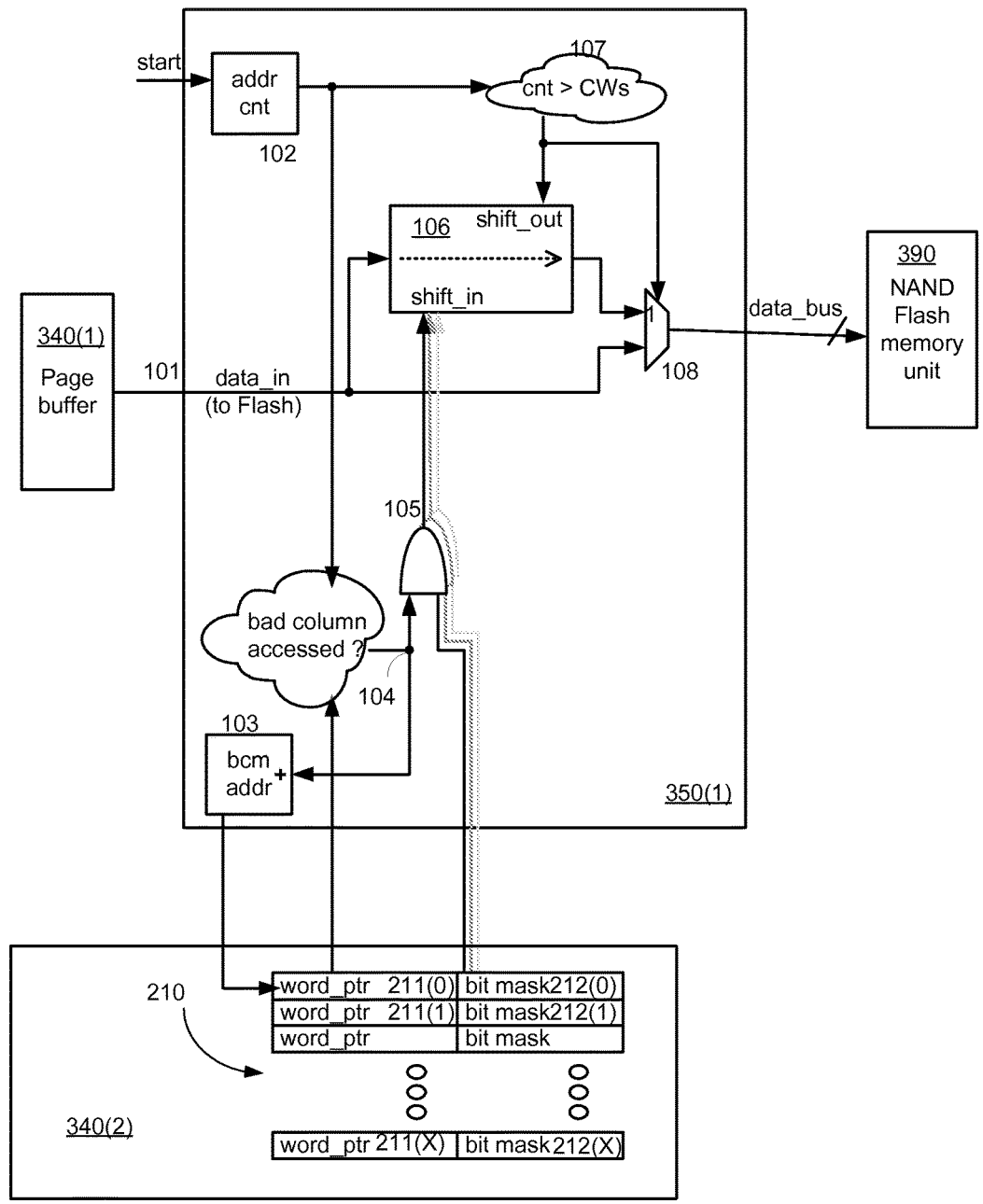
FIG. 8 illustrates a portion of a write circuit of a flash memory controller according to an embodiment of the invention.
Figure 9:
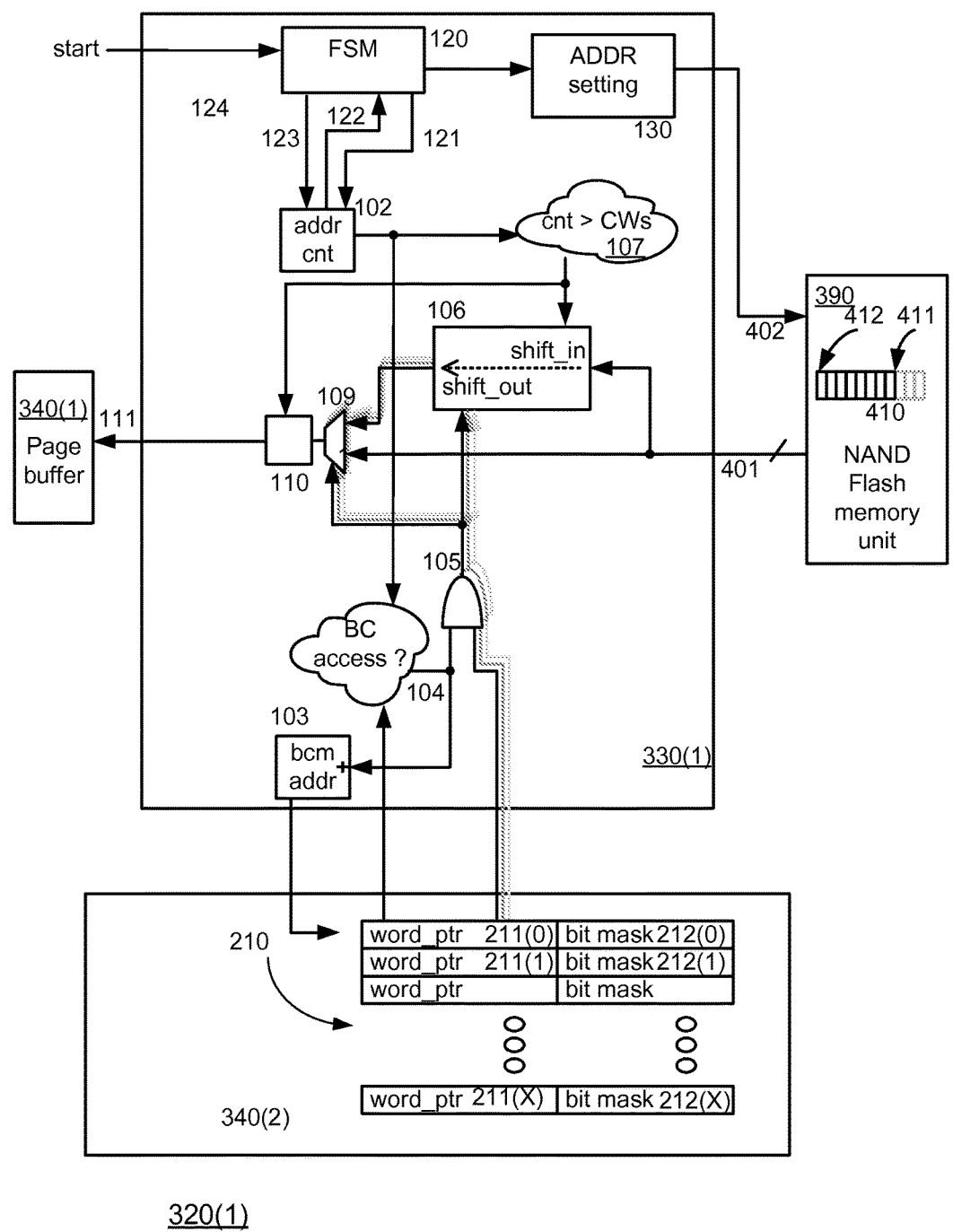
FIG. 9 illustrates a portion of a read circuit of a flash memory controller according to an embodiment of the invention.
Figure 10:
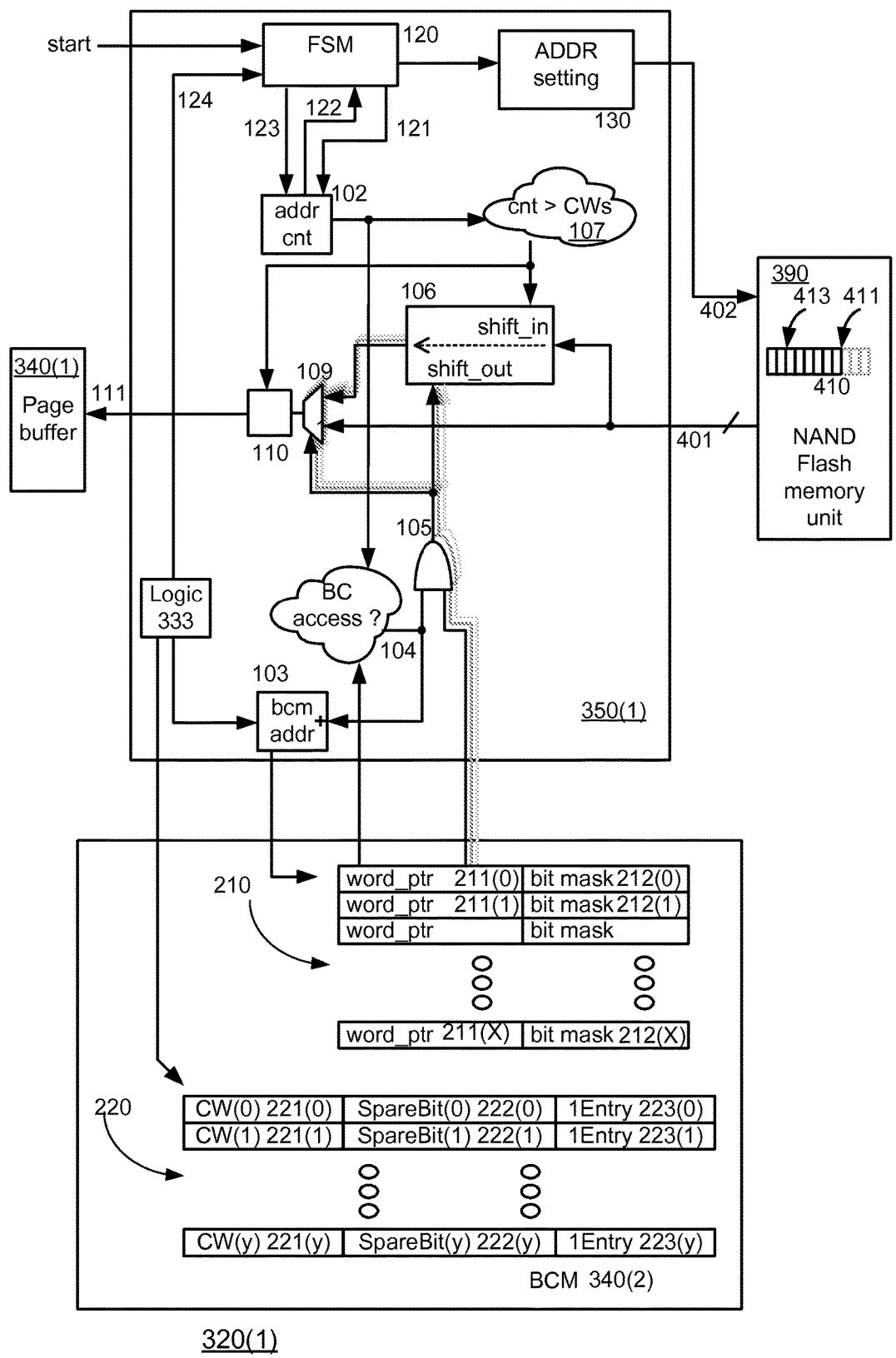
FIG. 10 illustrates a portion of a read circuit of a flash memory controller according to an embodiment of the invention.

FIGS. 8-10 illustrate portions of the flash memory controller 333 according to various embodiments of the invention.

Bad columns detection information is gathered and saved in BCM—Bad Column Memory (say implemented in Random Access Memory) 340(2) that is accessible by the NI unit and holds the data required for bits replacement. Each line of this memory holds:
   a. Pointer to a Word (say 16 bits) in a page that holds at least 1 bad column.
   b. Bit mask (16 bits for example) that specifies the bad bit within this Word.

The number of BCM lines should equal to the maximal number of bad columns that is guaranteed by the manufacturer.

As bad column is a bit line defect, same bits should be replaced in all pages that use the same sense amplifier (typically a Flash Plane). Hence, a single BCM database may be sufficient to replace all bad columns in this Flash Plane. If the Flash device consists of multiple planes, multiple BCMs are required.

FIG. 8 describes the implementation of Flash page program circuit with bad bits replacement. Normally, data (aggregated codewords) streams in from a page buffer 340(1) within a memory unit 340 of a control circuit 310 of flash memory controller 333, into NI unit port 101 and address counter 102 counts each Word that is sent to the NAND flash memory unit 390. The invention suggests another BCM address counter 103 to point the BCM relevant line, this counter is initiated to the value "0" before each program operation begins. Data begins to flow from data in port 101 to the flash device while page address counter 102 counts the outgoing Words. Once the page address counter 102 reaches the first Word that consists a bad column (equals first word pointer 211(0)), "bad column accessed logic" output wire 104 is asserted driving the input of the AND gate 105 high. The first bit mask 212(0) is present on the other input of AND gate 105. AND gate 105 is duplicated for each bit in the Word (say 16 bits—i.e. gates 105.0-105.15). The outputs of AND gates 105 cause relevant bits of data in bus 101 to be shifted into the spare register 106. The bit size of the spare register should equal the maximal number of bad columns that manufacturer guaranties. Single or multiple bits may be asserted on the bit mask bus and so single or multiple bits may be shifted into the spare register each clock cycle in a LSB→MSB order. Since wire 104 is asserted, the BCM address counter 103 (line pointer) is incremented. The data continues flowing through the NI unit, page address counter 102 continues running, and when it equals the next Word pointer 211(1), data in bus bits are replaced according to bit mask 212(1), and BCM address 103 is incremented again.

This flow continues until all aggregated codewords were driven in from the page buffer 340(1). At this time page address comparator 107 output pin is asserted causing spare register 106 to shift out a Word each clock cycle. Meanwhile, the select to data MUX 108 select signal is also set causing data from spare register 106 to flow in the NAND Flash memory unit 390 direction on the data bus. During shift data out of spare register 106, zeros may be shifted in (for end zeros padding). The flow ends when the number of Words sent to the Flash device equals the page size.

Note that bad columns may be present in the spare area (end of the Flash page). As this area is relatively small compared to the page size, not replacing those bits will probably not add many error to the programmed page, and when reading, those errors can be fixed by error correction circuitry. However, those bits can be replaced during program operation as long as the Flash page size is no smaller than the sum of aggregated codewords and the maximum bad columns.

FIG. 9 describes the implementation of Flash page read circuit with bad bits replacement. Normally, Flash page data comes in from NAND flash memory unit 390 on data bus 401 single Word (say 16 bits) at a clock cycle and driven to page buffer 340(1) on data bus 111. The transaction ends when page size Words were read. The invention suggests replacement of the bad column bits by the NI unit 350, meaning that aggregated codewords+spare bits stream in from the NAND Flash memory unit 390 and only aggregated codewords stream out to page buffer 340(1).

NAND Flash interface protocol allows reading from any desired Word offset of the page register 410 in the NAND Flash memory unit 390 that holds the latched array data.

When the controller signals to start reading, a finite state machine (FSM 120) is responsible to first read the spare area of the page register and later the aggregated codewords.

Spare area read FSM 120 controls the Flash page offset setting by using address setting circuitry 130. At first FSM 120 sets the page register 410 read pointer to offset 411. FSM 120 also activates page address counter 102 (via interface 121) to count Words starting at the spare page area, thus page address comparator 107 result is asserted (counter greater than aggregated codewords). Assertion of this signal causes on one hand incoming data Words on data bus 401 to be shifted into spare register 106, and on the other hand enable circuitry 110 to block data from being driven to page buffer 340(1). When page address counter 102 reaches page end it signals FSM 120 "spare read done" via interface 122.

Aggregated codewords read FSM 120 than sets Flash device page register offset to 411 (typically 0) and activates page address counter 102 again (via interface 123) to start counting from the value set in page register 410 to offset 412. At this stage BCM address counter 103 is set to 0, thus pointing the first BCM line. Page data starts streaming in and page address counter 102 counts each incoming Word. Once page counter 102 reaches the BCM output 211(0) (selected wordptr), "bad column accessed logic" output wire 104 is asserted.

Then:
  c. AND gates 105 drive logical "1" for any bit set on the current bit mask 212(0).
  d. The amount of "to be replaced bits" are shifted out of spare register 106.
  e. Bit mask 212(0) specified bits are replaced by MUX 109.
  f. BCM address (line pointer) counter 103 is incremented to point the next line.

Since page address counter was activated to count from page start, the data out circuitry 110 does not block the data out bus 111 that drives Word by Word to the page buffer 340(1).

In the next clock cycle the incoming the page address counter output 102 is again compared vs. the next BCM line Word pointer that is now present on the BCM output 211(0). Total amount of aggregated codewords is read from Flash memory unit 390 and by searching the BCM entries all bad columns are replaced.

Bad column located in the spare area can be replaced, more on that is described later.

FIG. 10 illustrates a portion 320(1) of a read circuit 320 capable of random access reading of codewords according to an embodiment of the invention.

Sometimes the system needs to read only a portion of a Flash page. As the Flash page holds ECC codewords this random read is aligned to a codeword start (say second codeword out of four codewords in a page). In such a case, the relevant BCM pointers may start from another BCM line than line 0 (as some lines may hold pointers to bad columns in the first codeword).

Two methods are suggested to handle such cases:
  g. First method: the read flow in this case begins with regular spare area read, FSM 120 sets spare area page offset 411, and uses interfaces 121 and 122 to shift out the spare area bits. Than FSM 120 signals the BCM address counter 103 via interface 124 to scan the BCM until a Word pointer is within the relevant (in our example second) codeword boundaries. Each clock cycle the BCM line pointer is incremented by 1. During scanning phase irrelevant replacement bits (of first codeword in this example) may shift out of spare register 106 each cycle. Scanning phase is done when a BCM line with a Word pointer within the relevant codeword (or higher one) is reached. As a result "scan done" is signaled over interface 124 to FSM 120. From this point on, FSM 120 uses interface 123 to set Flash page offset to the desired codeword start 413, and reading is done with the desired length (single codeword or longer).

Using this way the scanning stage is time consuming and may affect the system performance.
  h. Second method: We assume that random reads start from few constant offsets in a page (codewords starts) and that this start is aligned to Word resolution. In order to save previous method scanning time, it is suggested that another database is saved in the controller.

The bit location of first replacing bit of the codeword in the spare area (I) First relevant BCM line for the read codeword (II).

Read flow is as follows.

FSM 120 sets the page Word offset 411, using page address setting circuitry 130, to the Word that holds the first replacing bit (I). FSM 120 than reads the spare area from this offset to the end of the page (or until all replacing bits for the relevant codewords are read). Note that it may be required to shift out some bits from spare register 106 since the first read Word from spare area may hold some bits of a codeword that is not being read.

Now FSM 120 loads BCM address counter 103 with the first relevant BCM line (II) via interface 124. FSM 120 also sets the page offset in the Flash to Word 413 address setting circuitry via control bus 402. From this point on, reading is done as in the data read phase of a whole page.

Figure 7:
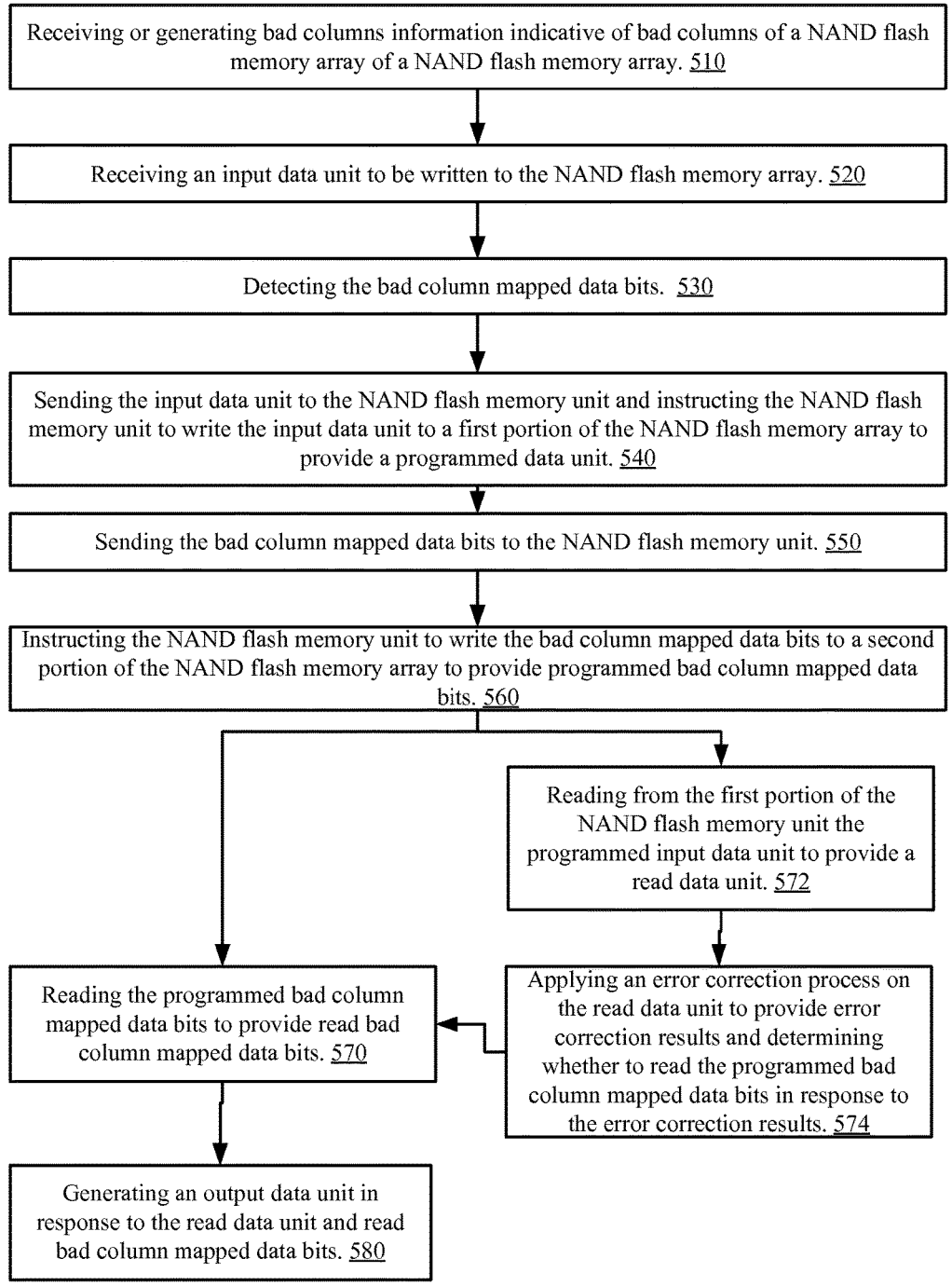
FIG. 7 illustrates a method according to an embodiment of the invention.

FIG. 7 is a flow chart of a method 500 according to an embodiment of the invention.

Method 500 may start by stage 510 of receiving or generating bad columns information indicative of bad columns of a NAND flash memory array of a NAND flash memory array.

The bad columns information has a column resolution—each column of the NAND flash memory array can be tagged as good or bad (or associated a reliability level that may have more than two possible values) based upon errors detected in flash memory cells that belong to these columns. This is a finer resolution than chuck based (multiple column) resolution.

The bad column information can be generated, for example, by method 400.

Stage 510 may be followed by stage 520 of receiving an input data unit to be written to the NAND flash memory array.

The input data unit may include bad column mapped data bits that are mapped to flash memory cells that belong to bad columns of the NAND flash memory array. The input data unit may be, for example, a word of a page and the method may be repeated for each word of that page. The bad column mapped data bits may be referred in the following text (for example in relation to FIG. 8-10) as "spare bits."

Stage 520 may be followed by stage 530 of detecting the bad column mapped data bits. Stage 530 may include storing the bad column mapped data bits in bad column mapped memory unit of the flash memory controller. This bad column mapped memory unit can be a shift register, can be volatile or non-volatile. It may be referred to (for example—in pages 8-10) as a "spare bits register".

Stage 530 may include detecting the bad column mapped data bits in response to a first data structure that maps flash memory cells of bad columns to locations of bad column mapped data bits within the input data unit. FIGS. 8 and 9 illustrate an example of a first data structure that is stored in a bad column memory (BCM). It includes a bit map (that tags bad and good flash memory cells) for each word of a page.

FIG. 10 illustrates an example of a first data structure 210 and of a second data structure 220 that are stored in a bad column memory (BCM) 200. The first data structure 210 includes a bit map (that tags bad and good flash memory cells) for each word of a page—bit maps 212(0)-212(x) for x words 211(0)-211(x) of a page. The second data structure 220 maps codewords (221(0)-221(y)) to (i) content of the second portion of the NAND flash memory array (223(0)-223(y)) and to (ii) entries of the first data structure (222(0)-222(y)).

Stage 530 may be followed by stage 540 of sending the input data unit to the NAND flash memory unit and instructing the NAND flash memory unit to write the input data unit to a first portion of the NAND flash memory array to provide a programmed data unit.

Stage 540 may be followed by stage 550 of sending the bad column mapped data bits to the NAND flash memory unit. It is noted that the bad column mapped data can be stored on the NAND flash memory unit or in any other memory unit of any type. Furthermore, it may be stored once in the NAND flash memory unit in a particular location and not every time new data is written. It is then read only once, when the system starts up, and a memory controller reads the bad column mapped data from the NAND flash memory unit.

Stage 550 may be followed by stage 560 of instructing the NAND flash memory unit to write the bad column mapped data bits to a second portion of the NAND flash memory array to provide programmed bad column mapped data bits. It is noted that the first and second portions can be programmed concurrently and can belong to a same page.

This second portion can be referred to as a spare area. The second portion can include bad columns or may be free of bad columns. If it includes bad columns than any of the schemes illustrated in this application (such as bit skipping) can be applied.

The first and second portions of the NAND flash memory array belong to a same physical page of the NAND flash memory array.

Stage 560 may be followed by either one of stages 570 and 572.

Stage 570 includes reading the programmed bad column mapped data bits to provide read bad column mapped data bits.

Stage 572 may include reading from the first portion of the NAND flash memory unit the programmed input data unit to provide a read data unit.

Stage 572 may be followed by stage 574 of applying an error correction process on the read data unit to provide error correction results and determining whether to read the programmed bad column mapped data bits in response to the error correction results. If, for example, the error correction process corrected all the errors then there is no need in reading the programmed bad column mapped data bits.

If it is determined to read the programmed input data unit then stage 574 is followed by stage 570—else it is followed by stage 580 of generating an output data unit in response to the read data unit and read bad column mapped data bits.

Stage 580 may include replacing bits of the read data unit that were mapped to flash memory units of bad columns by read bad column mapped data bits.

Stage 580 may include error correcting the read data unit using information obtained from the read bad column mapped data bits.

Bad Columns Spreading Schemes

Figure 11:
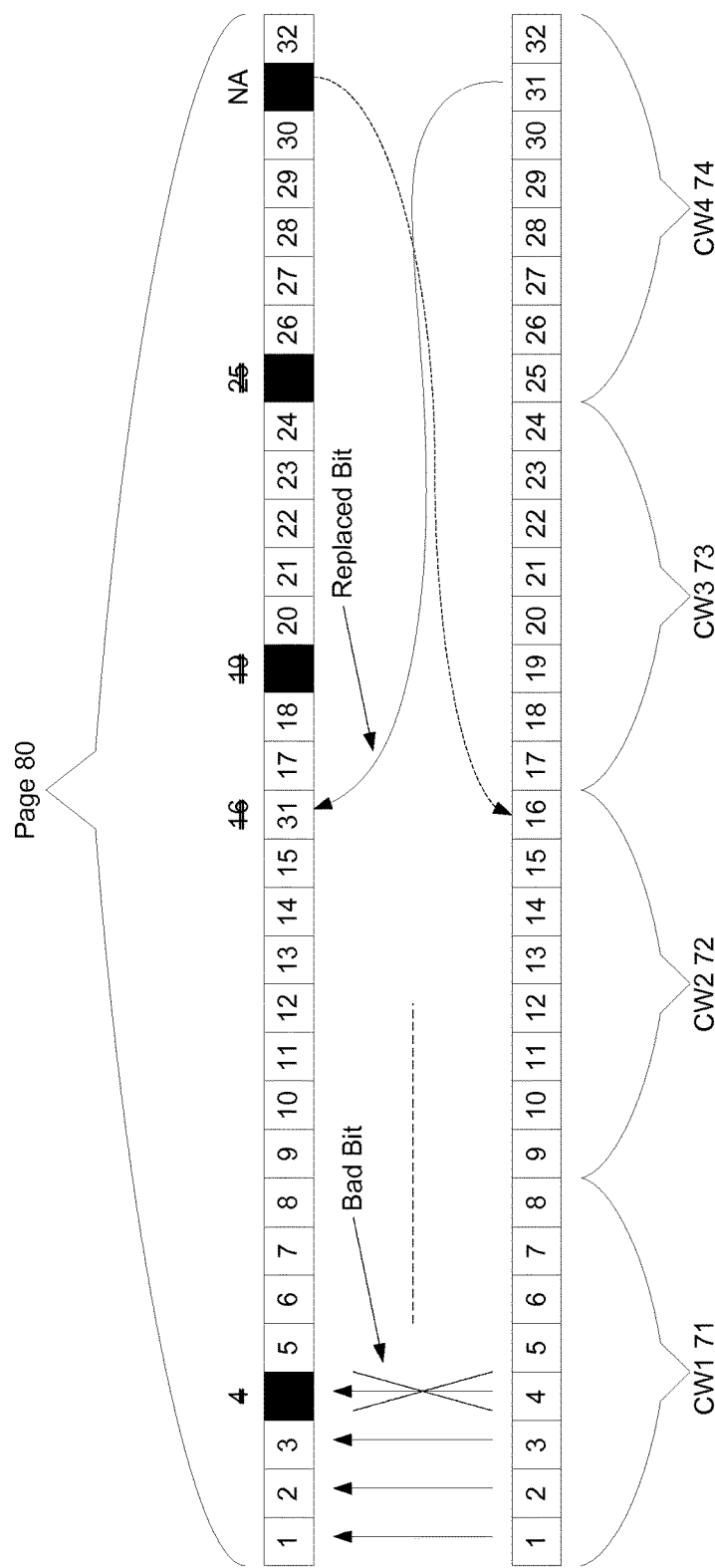
FIG. 11 illustrates a mapping of codewords to flash memory cells and an updated mapping of codewords to flash memory cells according to an embodiment of the invention.

Next we consider a different type of handling of bad columns. Bad-columns may be arbitrarily distributed in a device. Therefore, the bad columns may be unevenly distributed between the codewords. FIG. 11 shows an example of an imaginary page 80 with 32 bits with 4 bad columns—represented by black boxes in bits 4, 19, 25 and 31. There are also 4 codewords (CWs) 71-74 in this example with CW 1 suffering from 1 bad column, CW2 having no bad columns, CW3 having 1 bad column and CW 4 having 2 bad columns. This means that CW4 has a higher probability of decoding failure than the rest of the CWs. Furthermore, CW2 has higher probability of decoding success than the others.

To even out the probability of decoding success, According to an embodiment of the invention it may be desirable to spreading the effect of the bad columns across the CWs. In FIG. 11 this is done by using one of the bits of CW2 to replace a bad column of CW4 and writing content of CW2 to the bad bit. Thus, before programming, bit 31 (in CW4) is copied to position 16 (in CW2) and the programming is performed. After reading the page, bit 16 is placed in the position of bit 31 and decoding is done for all 4 codewords. Effectively, each codeword has 1 "bad" bit, whether because of a real or virtual bad-column.

Figure 12:
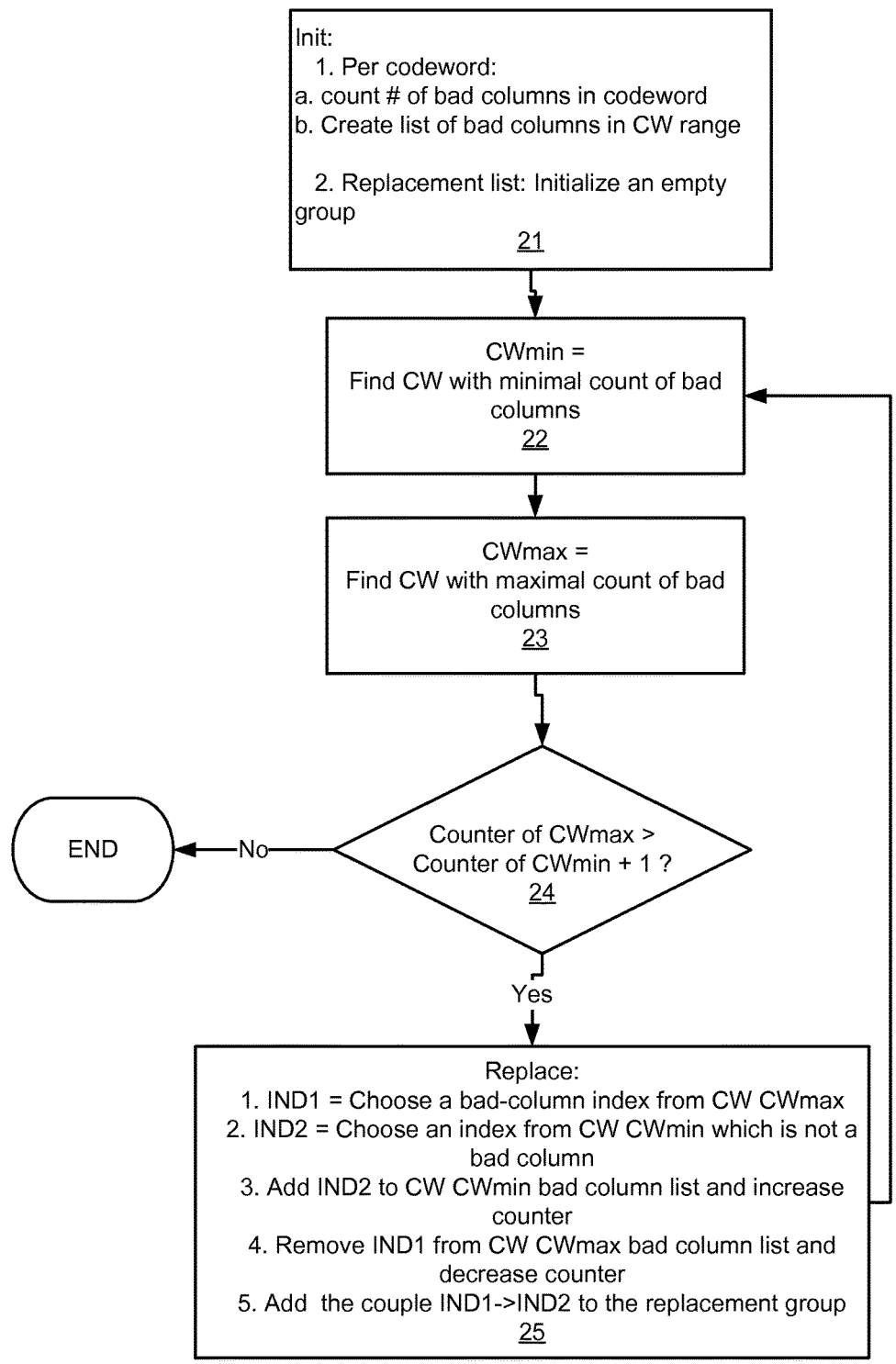
FIG. 12 illustrates a method according to an embodiment of the invention.

In general, to even out bad columns across codewords the scheme of FIG. 12 may be used. According to the method 20 of FIG. 12, good columns belonging to certain codewords are arbitrarily chosen to replace bad columns. However, we may choose these good columns such that if they were flipped to be bad columns their effect on decoding may be the least. The choice of such columns of course depends on the choice of the coding technique. Method 20 includes stages 21, 22, 23 and 24 and tries to spread bad flash memory cells between codewords—starting from replacing bits from a codeword that is mapped to a lowest number of bad bits with the bits from another codeword that is mapped to a highest number of bad bits.

Finally, the spreading scheme above does not include column replacement in the case where the total data in the codewords is smaller than the data in the page. The two schemes may be combined to create a joint replacement spreading scheme such that if the number of columns+the total number of bits in the concatenated codewords is larger than a page, the bad columns are evenly spread across the codewords.

Code Definition to Account for Bad Columns

In general, the number of bad columns in a NAND device is random and changes between one device and another. The manufacturer guaranties that the maximum number of bad columns will not exceed a certain maximum but this is typically much larger than the actual number of bad columns. Therefore, the size of the redundancy may be chosen as a function of the distribution of bad columns.

We can define a BER function of the code which is a function that defines the BER the code can handle given a certain amount of bad columns that were not replaced and given the available redundancy.

Example: Fber(Nred,Nbad_columns)=A*Nred−B*Nbad_columns.
  a. Nred=number of redundancy bits
  b. Nbad_columns=number of bad columns that were not replaced A and B are parameters that approximate the capability of the code. The code may be BCH, BCH with erasure and the like, LDPC with hard or soft or erasure decoding, Other examples of BER functions are also possible.

In addition, we also define a function that relates between the distribution of bad columns and the redundancy of a code word.

Example:
  a. Preduced-bad-columns(k,Nred)=Pbad_columns(k').
  b. k'=k+Nred−C.
  c. Pbad_columns(k') is the distribution of the number of bad columns across dies of the flash memory unit and C is some constant.

Other examples of distributions are also possible.

Therefore, given the above distribution and BER functions we can optimize the choice of redundancy to maximize a score function. Examples:
  a. Maximize average handled BER, wherein the average handled BER equals a sum (over k values ranging from zero to a maximal number of errors) of Preduced_bad_columns(k,Nred) multiplied by Fber(Nred,k).
  b. Maximize BER under an outage probability limitation so that the chosen redundancy is maximized such that the sum of Preduced-bad-columns(k,Nred) over k greater than 0 is still smaller than some limit (Outage limit).

$$\underset{s.t.}{\text{maximize}} \; n_{red} \quad P_{reduced\,bad\,columns}(k > 0, n_{red}) \leq \text{Outage limit}$$

Adaptive Code Definition Upon Device Initialization

Another alternative is to define the code redundancy upon controller initialization. A controller is always coupled with a set of devices. Once the devices are chosen, the bad columns are fixed. Therefore, the redundancy may be adapted to that bad columns configuration such as to replace all bad columns and thus maximize the handled BER for that die configuration.

Note that the redundancy may be configured only to a predefined set of values. In that case the redundancy is chosen for a given die configuration to maximize Fber(Nred, Nbad_columns+Nred−C).

Concatenated Dies

In some systems data is written on several NAND flash dies and codewords may be programmed across two dies (first part of a codeword on one die and the last part of the codeword on another die) or even more than two dies. In this case, we can think of several dies as one supper die and add up all the bad columns together and apply all the algorithms above (bit skipping, replacement, etc.) to the supper die instead of a single die. Furthermore, we can apply the redundancy selection methods above to the supper die rather than a single die. This allows improving some of the results since now the number of bad columns is effectively averaged over several dies.

The invention may also be implemented in a computer program for running on a computer system, at least including code portions for performing steps of a method according to the invention when run on a programmable apparatus, such as a computer system or enabling a programmable apparatus to perform functions of a device or system according to the invention. The computer program may cause the storage system to allocate disk drives to disk drive groups.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on a non-transitory computer readable medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

I claim:

1. A method for detecting bad columns of a NAND flash memory array, comprising:
    sending input data to a NAND flash memory unit that comprises the NAND flash memory array and instructing the NAND flash memory unit to write the input data to the NAND flash memory array to provide programmed data;
    reading from the NAND flash memory array the programmed data to provide read data;

comparing the input data and the read data to provide column error statistics that is indicative of a number of errors per column;
wherein the NAND flash memory array comprises multi-level flash memory cells and is configured to store different types of pages that include a most significant bit (MSB) page that is programmed using MSB programming and a least significant bit (LSB) page that is programmed using LSB programming;
wherein the column error statistics comprises column error statistics for each page in the different types of pages; and
defining, by a flash memory controller, bad columns of the NAND flash memory array in response to the column error statistics.

2. The method according to claim 1, wherein the defining of the bad columns comprises defining a column of the NAND flash memory array as a bad column if a number of errors associated with the column exceeds an error threshold.

3. The method according to claim 1, wherein the method comprises assigning a reliability score per each column in response to a number of errors associated with the column; wherein the NAND flash memory array is an erase block that has a given number of pages; wherein the reliability score of each column comprises a logarithm of a ratio between a number of errors in the column and the given number of pages minus the number of errors in the column.

4. The method according to claim 1, comprising defining an encoding scheme for data units to be written to the NAND flash memory array while constraining a value of bits to be written to the bad columns to be of an erase value.

5. The method according to claim 1, comprising:
receiving, by the flash memory controller, an input data unit to be written to the NAND flash memory array;
generating, by the flash memory controller, an updated data unit by adding dummy bits to the input data unit at locations of the updated data unit that are going to be written to any of the bad columns of the NAND flash memory array; and
sending the updated data unit to the NAND flash memory unit and instructing the NAND flash memory unit to write the updated data unit to the NAND flash memory array.

6. The method according to claim 5, wherein a value of a dummy bit to be written, instead a data bit, to a flash memory cell of a bad column equals a value of the data bit.

7. The method according to claim 1, comprising defining a mapping of bits of codewords to flash memory cells of the NAND flash memory unit in response to locations of the bad columns.

8. The method according to claim 7, wherein the defining of the mapping reduces an effect of an uneven distribution of bad columns within NAND flash memory unit portions allocated for storing the codewords.

9. The method according to claim 7, wherein a mapping of bits of a codeword of the codewords, is further responsive to a relationship between (a) a size of a NAND flash memory unit portion allocated for storing the codeword, and (b) a sum of (i) a size of the codeword and (ii) a number of flash memory cells that belong to a bad column within the NAND flash memory unit portion allocated for storing the codeword.

10. The method according to claim 1, comprising swapping bits that belong to different codewords in response to an amount of bad columns and to a location of bad columns in NAND flash memory units portions initially allocated for storing the different codewords.

11. A method for detecting bad columns of a NAND flash memory array, comprising:
sending input data to a NAND flash memory unit that comprises the NAND flash memory array and instructing the NAND flash memory unit to write the input data to the NAND flash memory array to provide programmed data;
reading from the NAND flash memory array the programmed data to provide read data;
comparing the input data and the read data to provide column error statistics that is indicative of a number of errors per column;
defining, by a flash memory controller, bad columns of the NAND flash memory array in response to the column error statistics;
determining an encoding parameter in response to the column error statistics; and
assigning a reliability score per each column in response to a number of errors associated with the column, wherein the reliability score of each column comprises a logarithm of a ratio between a number of errors in the column and the given number of pages minus the number of errors in the column.

12. The method according to claim 11 wherein the encoding parameter is a bit error rate of a code to be used for providing codewords.

13. The method according to claim 11 wherein the encoding parameter is a number of redundancy bits to be allocated per codeword.

14. The method according to claim 13 wherein the number of redundancy bits is determined to optimize a value of a function of (a) bad column distribution between different dies of the NAND flash memory unit and (b) a bit error rate function.

15. The method according to claim 11 wherein the determining is responsive to column error statistics of different dies of NAND flash memory unit that are activated at a certain point in time.

16. The method according to claim 11 wherein the encoding parameter is a bit error rate of a code to be used for providing codewords.

17. The method according to claim 11 wherein the flash memory array is spread over multiple dies of the flash memory unit.

18. A non-transitory computer readable medium that stores instructions to be executed by a computer and cause the computer to perform stages comprising:
instructing a NAND flash memory unit that comprises a NAND flash memory array to write input data to the NAND flash memory array to provide programmed data;
reading from the NAND flash memory array the programmed data to provide read data;
comparing the input data and the read data to provide column error statistics that is indicative of a number of errors per column;
wherein the NAND flash memory array comprises multi-level flash memory cells and is configured to store different types of pages that include a most significant bit (MSB) page that is programmed using MSB programming and a least significant bit (LSB) page that is programmed using LSB programming;
wherein the column error statistics comprises column error statistics for each page in the different types of pages; and defining, by a flash memory controller, bad columns of the NAND flash memory array in response to the column error statistics.

19. A system, comprising a flash memory controller that comprises a control circuit and an interface;
   wherein the interface is arranged to instruct a NAND flash memory unit that comprises a NAND flash memory array to write input data to the NAND flash memory array to provide programmed data;
   wherein the interface is arranged to read from the NAND flash memory array the programmed data to provide read data;
   wherein the control circuit is arranged to:
   (a) compare the input data and the read data to provide column error statistics that is indicative of a number of errors per column;
   wherein the NAND flash memory array comprises multi-level flash memory cells and is configured to store different types of pages that include a most significant bit (MSB) that is programmed using MSB programming page and a least significant bit (LSB) page that is programmed using LSB programming;
   wherein the column error statistics comprises column error statistics for each page in the different types of pages; and
   (b) define bad columns of the NAND flash memory array in response to the column error statistics.

20. The system of claim 19, wherein the control circuit assigns a reliability score per each column in response to a number of errors associated with the column, wherein the NAND flash memory array is an erase block that has a given number of pages, and wherein the reliability score of each column comprises a logarithm of a ratio between a number of errors in the column and the given number of pages minus the number of errors in the column.

* * * * *